(12) United States Patent
Tang et al.

(10) Patent No.: US 10,586,802 B2
(45) Date of Patent: Mar. 10, 2020

(54) CHARGE STORAGE APPARATUS AND METHODS

(71) Applicant: Micron Technology, Inc., Boise, ID (US)

(72) Inventors: Sanh D. Tang, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/691,442

(22) Filed: Aug. 30, 2017

(65) Prior Publication Data
US 2017/0365614 A1    Dec. 21, 2017

Related U.S. Application Data

(60) Continuation of application No. 14/987,370, filed on Jan. 4, 2016, now Pat. No. 9,754,953, which is a
(Continued)

(51) Int. Cl.
 H01L 27/11556 (2017.01)
 H01L 29/792 (2006.01)
(Continued)

(52) U.S. Cl.
CPC .. H01L 27/11556 (2013.01); H01L 27/11521 (2013.01); H01L 27/11524 (2013.01);
(Continued)

(58) Field of Classification Search
CPC ............... H01L 27/11556; H01L 27/11582
See application file for complete search history.

(56) References Cited

U.S. PATENT DOCUMENTS 5,473,179 A  *  12/1995  Hong ............... H01L 27/115
                                               257/321
7,705,388 B2    4/2010  Iwata
(Continued)

FOREIGN PATENT DOCUMENTS

CN        101409290 A       4/2009
CN        101483194 A       7/2009
(Continued)

OTHER PUBLICATIONS

"U.S. Appl. No. 13/035,700, Non Final Office Action dated Feb. 13, 2012", 8 pgs.
(Continued)

*Primary Examiner* — Mark V Prenty
(74) *Attorney, Agent, or Firm* — Schwegman Lundberg & Woessner, P.A.

(57) ABSTRACT

Methods of forming multi-tiered semiconductor devices are described, along with apparatus and systems that include them. In one such method, an opening is formed in a tier of semiconductor material and a tier of dielectric. A portion of the tier of semiconductor material exposed by the opening is processed so that the portion is doped differently than the remaining semiconductor material in the tier. At least substantially all of the remaining semiconductor material of the tier is removed, leaving the differently doped portion of the tier of semiconductor material as a charge storage structure. A tunneling dielectric is formed on a first surface of the charge storage structure and an intergate dielectric is formed on a second surface of the charge storage structure. Additional embodiments are also described.

8 Claims, 21 Drawing Sheets

Related U.S. Application Data continuation of application No. 14/310,790, filed on Jun. 20, 2014, now Pat. No. 9,231,117, which is a division of application No. 13/035,700, filed on Feb. 25, 2011, now Pat. No. 8,759,895.

(51) Int. Cl.

| | | |
|---|---|---|
| *H01L 27/11582* | (2017.01) | |
| *H01L 27/11578* | (2017.01) | |
| *H01L 21/28* | (2006.01) | |
| *H01L 27/11524* | (2017.01) | |
| *H01L 27/11521* | (2017.01) | |
| *H01L 29/04* | (2006.01) | |
| *H01L 29/167* | (2006.01) | |
| *H01L 29/49* | (2006.01) | |
| *H01L 29/788* | (2006.01) | |

(52) U.S. Cl.
CPC .. *H01L 27/11578* (2013.01); *H01L 27/11582* (2013.01); *H01L 29/04* (2013.01); *H01L 29/167* (2013.01); *H01L 29/40114* (2019.08); *H01L 29/40117* (2019.08); *H01L 29/495* (2013.01); *H01L 29/4966* (2013.01); *H01L 29/7889* (2013.01); *H01L 29/792* (2013.01); *H01L 29/7926* (2013.01)

(56) References Cited

U.S. PATENT DOCUMENTS

| | | | |
|---|---|---|---|
| 7,878,507 | B1 | 2/2011 | Dimond |
| 7,906,818 | B2 | 3/2011 | Pekny |
| 8,237,213 | B2 | 8/2012 | Lin |
| 8,508,997 | B2 * | 8/2013 | Tang ................ G11C 16/0458 365/185.17 |
| 8,759,895 | B2 | 6/2014 | Tang et al. |
| 8,803,214 | B2 | 8/2014 | Tang et al. |
| 9,093,370 | B2 | 7/2015 | Hwang |
| 9,231,117 | B2 | 1/2016 | Tang et al. |
| 9,379,005 | B2 | 6/2016 | Tang et al. |
| 9,754,953 | B2 | 9/2017 | Tang et al. |
| 9,780,115 | B2 | 10/2017 | Tang |
| 10,090,324 | B2 | 10/2018 | Tang et al. |
| 2002/0195668 | A1 | 12/2002 | Endoh et al. |
| 2006/0277355 | A1 | 12/2006 | Ellsberry et al. |
| 2007/0057310 | A1 | 3/2007 | Matsui et al. |
| 2007/0136537 | A1 | 6/2007 | Doblar et al. |
| 2007/0272973 | A1 | 11/2007 | Park et al. |
| 2008/0048237 | A1 | 2/2008 | Yoshihisa |
| 2008/0153226 | A1 | 6/2008 | Mokhlesi |
| 2008/0179659 | A1 | 7/2008 | Enda et al. |
| 2008/0277720 | A1 | 11/2008 | Youn et al. |
| 2009/0014858 | A1 | 1/2009 | Boon et al. |
| 2009/0097321 | A1 | 4/2009 | Kim et al. |
| 2009/0230454 | A1 | 9/2009 | Pekny |
| 2009/0230458 | A1 | 9/2009 | Ishiduki et al. |
| 2009/0267139 | A1 | 10/2009 | Maejima |
| 2009/0283819 | A1 | 11/2009 | Ishikawa et al. |
| 2009/0294828 | A1 | 12/2009 | Ozawa et al. |
| 2009/0294844 | A1 | 12/2009 | Tanaka et al. |
| 2010/0003795 | A1 | 1/2010 | Park et al. |
| 2010/0112769 | A1 | 5/2010 | Son et al. |
| 2010/0181612 | A1 | 7/2010 | Kito et al. |
| 2010/0240205 | A1 | 9/2010 | Son et al. |
| 2010/0244119 | A1 | 9/2010 | Fukuzumi et al. |
| 2010/0276743 | A1 | 11/2010 | Kuniya et al. |
| 2010/0327340 | A1 | 12/2010 | Oota et al. |
| 2011/0149656 | A1 | 6/2011 | Tang et al. |
| 2011/0316063 | A1 | 12/2011 | Tang et al. |
| 2012/0001250 | A1 | 1/2012 | Alsmeier |
| 2012/0217564 | A1 | 8/2012 | Tang et al. |
| 2014/0030856 | A1 | 1/2014 | Tang et al. |
| 2014/0302650 | A1 | 10/2014 | Tang et al. |
| 2016/0118392 | A1 | 4/2016 | Tang et al. |
| 2016/0300850 | A1 | 10/2016 | Tang et al. |
| 2018/0047747 | A1 | 2/2018 | Tang et al. |
| 2019/0006387 | A1 | 1/2019 | Tang et al. |

FOREIGN PATENT DOCUMENTS

| | | |
|---|---|---|
| CN | 101911287 A | 12/2010 |
| CN | 103038882 A | 4/2013 |
| CN | 103403861 A | 11/2013 |
| CN | 103038882 B | 10/2016 |
| EP | 2586060 A2 | 5/2013 |
| JP | 06338602 A | 12/1994 |
| JP | 10500790 A | 1/1998 |
| JP | 2005353061 A | 12/2005 |
| JP | 2007520826 A | 7/2007 |
| JP | 2007318083 | 12/2007 |
| JP | 2008160004 A | 7/2008 |
| JP | 2008171838 A | 7/2008 |
| JP | 2010010688 | 1/2009 |
| JP | 2009093599 A | 4/2009 |
| JP | 2009117843 | 5/2009 |
| JP | 2009117843 A | 5/2009 |
| JP | 2009158775 A | 7/2009 |
| JP | 2009224466 A | 10/2009 |
| JP | 2009266945 A | 11/2009 |
| JP | 2010102755 A | 5/2010 |
| JP | 2010130016 A | 6/2010 |
| JP | 2010147125 A | 7/2010 |
| JP | 2010171185 A | 8/2010 |
| JP | 2010225946 A | 10/2010 |
| JP | 2011035228 A | 2/2011 |
| KR | 100866966 B1 | 11/2008 |
| KR | 20090037690 A | 4/2009 |
| KR | 1020100036520 A | 4/2010 |
| KR | 20100053393 A | 5/2010 |
| KR | 1020100053393 A | 5/2010 |
| SG | 10201505052 A | 7/2015 |
| TW | 201246396 A | 11/2012 |
| WO | WO-2006132158 A1 | 12/2006 |
| WO | WO-2009084206 A1 | 7/2009 |
| WO | WO-2009114675 A2 | 9/2009 |
| WO | WO-2010018710 A1 | 2/2010 |
| WO | WO-2012009140 A2 | 1/2012 |
| WO | WO-2012116207 A1 | 5/2012 |
| WO | WO-2012116207 A2 | 8/2012 |

OTHER PUBLICATIONS

"U.S. Appl. No. 13/035,700 , Response filed Oct. 29, 2012 to Final Office Action dated Jul. 27, 2012", 10 pgs.

"U.S. Appl. No. 13/035,700, Final Office Action dated Jul. 27, 2012", 9 pgs.

"U.S. Appl. No. 13/035,700, Notice of Allowance dated Feb. 24, 2014", 7 pgs.

"U.S. Appl. No. 13/035,700, Notice of Allowance dated Mar. 20, 2013", 8 pgs.

"U.S. Appl. No. 13/035,700, Notice of Allowance dated Oct. 9, 2013", 9 pgs.

"U.S. Appl. No. 13/035,700, Response filed May 14, 2012 to Non Final Office Action dated Feb. 13, 2012", 13 pgs.

"U.S. Appl. No. 13/035,700, Restriction Requirement dated Oct. 19, 2011", 9 pgs.

"U.S. Appl. No. 14/310,790, Non Final Office Action dated Oct. 30, 2014", 8 pgs.

"U.S. Appl. No. 14/310,790, Notice of Allowance dated Apr. 29, 2015", 7 pgs.

"U.S. Appl. No. 14/310,790, Notice of Allowance dated Sep. 1, 2015", 7 pgs.

"U.S. Appl. No. 14/310,790, Response filed Jan. 16, 2015 to Non Final Office Action dated Oct. 30, 2014", 7 pgs.

"U.S. Appl. No. 14/987,370, Non Final Office Action dated Jul. 15, 2016", 10 pgs.

"U.S. Appl. No. 14/987,370, Notice of Allowance dated May 8, 2017", 7 pgs.

"U.S. Appl. No. 14/987,370, Notice of Allowance dated Dec. 20, 2016", 7 pgs.

(56) References Cited

OTHER PUBLICATIONS

"U.S. Appl. No. 14/987,370, Response filed Nov. 15, 2016 to Non Final Office Action dated Jul. 15, 2016", 8 pgs.
"Chinese Application Serial No. 201280010535.6, Office Action dated Jun. 28, 2016", W/ English Translation, 15 pgs.
"Chinese Application Serial No. 201280010535.6, Office Action dated Oct. 10, 2015", W/ English Translation, 25 pgs.
"Chinese Application Serial No. 201280010535.6, Response filed Feb. 24, 2016 to Office Action dated Oct. 10, 2015", W/ English Claims, 20 pgs.
"Chinese Application Serial No. 201280010535.6, Response filed Nov. 11, 2016 to Office Action dated Jun. 28, 2016", w/English Claims, 20 pgs.
"Chinese Application Serial No. 201280010535.6, Response filed Dec. 20, 2016 to Office Action dated Jun. 28, 2016", W/ English Translation of Claims, 16 pgs.
"European Application Serial No. 12749034.0, Extended European Search Report dated Dec. 1, 2016", 9 pgs.
"European Application Serial No. 12749034.0, Partial Supplementary European Search Report dated Aug. 31, 2016", 7 pgs.
"International Application Serial No. PCT/US2012/026358, International Preliminary Report on Patentability dated Sep. 6, 2013", 5 pgs.
"International Application Serial No. PCT/US2012/026358, Search Report dated Oct. 4, 2012", 3 pgs.
"International Application Serial No. PCT/US2012/026358, Written Opinion dated Oct. 4, 2012", 3 pgs.
"Japanese Application Serial No. 2013-555567, Amendment filed Feb. 10, 2015", W/ Machine Translation of Claims, 11 pgs.
"Japanese Application Serial No. 2013-555567, Office Action dated Mar. 17, 2015", W/ English Translation, 6 pgs.
"Japanese Application Serial No. 2013-555567, Response filed Dec. 10, 2015 to Office Action dated Mar. 17, 2015", W/ English Claims, 8 pgs.
"Korean Application Serial No. 10-2013-7025314 Response filed Jun. 16, 2015 to Office Action dated May 21, 2015", W/ English Claims, 22 pgs.
"Korean Application Serial No. 10-2013-7025314, Amendment filed May 15, 2015", W/ English Claims, 31 pgs.
"Korean Application Serial No. 10-2013-7025314, Office Action filed May 21, 2015", W/ English Translation, 7 pgs.
"Taiwanese Application Serial No. 101105342, Amendment filed Feb. 13, 2015", W/ English Claims, 7 pgs.
"Taiwanese Application Serial No. 101105342, Office Action dated Apr. 28, 2015", W/ English Translation, 6 pgs.
"Taiwanese Application Serial No. 101105342, Response filed Jul. 24, 2015 to Office Action dated Apr. 28, 2015", W/ English Claims, 10 pgs.
Kim, Jiyoung, et al., "Novel 3-D structure for ultra high density flash memory with VRAT (Vertical-Recess-Array-Transistor) and PIPE (Planarized Integration on the same PlanE)", 2008 Symposium on VLSI Technology, (Jun. 17-19, 2008), 122-23.
Komori, Yosuke, et al., "Disturbless Flash Memory due to High Boost Efficiency on BiCS Structure and Optimal Memory Film Stack for Ultra High Density Storage Device", International Electron Devices Meeting Technical Digest, (Dec. 2008), 851-854.
Tanaka, H., et al., "Bit Cost Scalable Technology with Punch and Plug Process for Ultra High Density Flash Memory", IEEE Symposium on VLSI Technology, (2007), 14-15.
"Chinese Application Serial No. 201180037212.1, Amendment filed Jun. 22, 2016", w/English Translation, 11 pgs.
"Chinese Application Serial No. 201180037212.1, Office Action dated Mar. 25, 2015", W/ English Translation, 18 pgs.
"Chinese Application Serial No. 201180037212.1, Office Action dated Apr. 29, 2016", w/English Translation, 5 pgs.
"Chinese Application Serial No. 201180037212.1, Office Action dated Nov. 25, 2015", w/English Translation, 9 pgs.
"Chinese Application Serial No. 201180037212.1, Response filed Feb. 3, 2016 to Office Action dated Nov. 25, 2015", w/English Claims, 85 pgs.
"Chinese Application Serial No. 201180037212.1, Response filed May 31, 2016 to Office Action dated Apr. 29, 2016", w/English Claims, 28 pgs.
"Chinese Application Serial No. 201180037212.1, Response filed Aug. 7, 2015 to Office Action dated Mar. 25, 2015", W/ English Claims, 23 pgs.
"European Application Serial No. 11807258.6, European Search Report dated Apr. 15, 2015", 6 pgs.
"European Application Serial No. 11807258.6, Extended European Search Report dated Jul. 15, 2015", 13 pgs.
"European Application Serial No. 11807258.6, Response filed Feb. 10, 2016 to Extended European Search Report dated Jul. 15, 2015", 21 pgs.
"International Application Serial No. PCT/US2011/041888, International Preliminary Report on Patentability dated Jan. 10, 2013", 9 pgs.
"International Application Serial No. PCT/US2011/041888, Search Report dated May 1, 2012", 4 pgs.
"International Application Serial No. PCT/US2011/041888, Written Opinion dated May 1, 2012", 6 pgs.
"Japanese Application Serial No. 2013-518511 Response filed Feb. 25, 2015 to Office Action dated Jul. 29, 2014", With the English claims, 11 pgs.
"Japanese Application Serial No. 2013-518511, Office Action dated Mar. 24, 2015", W/ English Translation, 4 pgs.
"Japanese Application Serial No. 2013-518511, Office Action dated Jul. 29, 2014", W/ English Translation, 11 pgs.
"Japanese Application Serial No. 2013-518511, Office Action dated Dec. 2, 2014", W/ English Translation, (Dec. 2, 2014), 4 pgs.
"Japanese Application Serial No. 2013-518511, Response filed Oct. 29, 2014 to Office Action dated Jul. 29, 2014", W/ English Claims, 25 pgs.
"Japanese Application Serial No. 2015-83308, Office Action dated Dec. 22, 2015", w/English Translation, 21 pgs.
"Japanese Application Serial No. 2015-83308, Response filed Mar. 17, 2016 to Office Action dated Dec. 22, 2015", w/English Claims, 7 pgs.
"Korean Application Serial No. 10-2013-7001962, Notice of Preliminary Rejection dated Mar. 30, 2018", w/ English Translation, 9 pgs.
"Korean Application Serial No. 10-2013-7001962, Notice of Preliminary Rejection dated Aug. 30, 2017", With English Translation, 6 pgs.
"Korean Application Serial No. 10-2013-7001962, Notice of Preliminary Rejection dated Nov. 30, 2018", W/ English Translation, 9 pgs.
"Korean Application Serial No. 10-2013-7001962, Response Filed Jan. 31, 2019 to Notice of Preliminary Rejection dated Nov. 30, 2018", w/English Claims, 14 pgs.
"Korean Application Serial No. 10-2013-7001962, Response filed Jun. 29, 2018 to Notice of Preliminary Rejection dated Mar. 30, 2018", w/ English Claims, 16 pgs.
"Korean Application Serial No. 10-2013-7001962, Response filed Oct. 30, 2017 to Notice of Preliminary Rejection dated Aug. 30, 2017", w/English Claims, 17 pgs.
U.S. Appl. No. 16/125,242, filed Sep. 7, 2018, Three Dimensional Memory and Methods of Forming the Same.
U.S. Appl. No. 12/825,211, Preliminary Amendment filed Mar. 21, 2011, 3 pgs.
U.S. Appl. No. 12/825,211, Restriction Requirement dated Feb. 21, 2012, 5 pgs.
U.S. Appl. No. 12/825,211, Response filed Mar. 22, 2012 to Restriction Requirement dated Feb. 21, 2012, 9 pgs.
U.S. Appl. No. 12/825,211, Non Final Office Action dated Jun. 7, 2012, 15 pgs.
U.S. Appl. No. 12/825,211, Response filed Sep. 7, 2012 to Non Final Office Action dated Jun. 7, 2012, 13 pgs.
U.S. Appl. No. 12/825,211, Final Office Action dated Feb. 1, 2013, 11 pgs.
U.S. Appl. No. 12/825,211, Response filed Apr. 30, 2013 to Final Office Action dated Feb. 1, 2013, 10 pgs.
U.S. Appl. No. 12/825,211, Notice of Allowance dated May 28, 2013, 12 pgs.

(56) References Cited

OTHER PUBLICATIONS

U.S. Appl. No. 12/825,211, Preliminary Amendment filed Sep. 26, 2013, 11 pgs.
U.S. Appl. No. 12/825,211, Notice of Allowance dated Mar. 31, 2014, 8 pgs.
U.S. Appl. No. 14/041,928, Preliminary Amendment filed Nov. 6, 2013, 6 pgs.
U.S. Appl. No. 14/041,928, Non Final Office Action dated Sep. 17, 2014, 12 pgs.
U.S. Appl. No. 14/041,928, Response filed Dec. 17, 2014 to Non Final Office Action dated Sep. 17, 2014, 7 pgs.
U.S. Appl. No. 14/041,928, Final Office Action dated Mar. 26, 2015, 12 pgs.
U.S. Appl. No. 14/041,928, Response to Final Office Action dated Mar. 26, 2015, 5 pgs.
U.S. Appl. No. 14/041,928, Non Final Office Action dated Aug. 19, 2015, 7 pgs.
U.S. Appl. No. 14/041,928, Response filed Nov. 19, 2015 to Non Final Office Action dated Aug. 19, 2015, 9 pgs.
U.S. Appl. No. 14/041,928, Notice of Allowance dated Feb. 24, 2016, 9 pgs.
U.S. Appl. No. 15/188,273, Non Final Office Action dated Dec. 1, 2016, 22 pgs.
U.S. Appl. No. 15/188,273, Resonse filed Apr. 28, 2017 to Non Final Office Action dated Dec. 1, 2016, 9 pgs.
U.S. Appl. No. 15/188,273, Notice of Allowance dated Jul. 13, 2017, 10 pgs.
U.S. Appl. No. 15/722,580, Preliminary Amendment filed Oct. 31, 2017, 7 pgs.
U.S. Appl. No. 15/722,580, Non Final Office Action Mar. 7, 2018, 14 pgs.
U.S. Appl. No. 15/722,580, Response filed Jun. 7, 2018 to Non-Final Office Action dated Mar. 7, 2018, 7 pgs.
U.S. Appl. No. 15/722,580, Notice of Allowance dated Jul. 27, 2018, 11 pgs.
U.S. Appl. No. 16/125,242, Non Final Office Action dated Jun. 25, 2019, 12 pgs.

\* cited by examiner

CHARGE STORAGE APPARATUS AND METHODS

RELATED APPLICATION

This is a continuation of U.S. application Ser. No. 14/987,370, filed Jan. 4, 2016, which is a continuation of U.S. application Ser. No. 14/310,790, filed Jun. 20, 2014, now issued as U.S. Pat. No. 9,231,117, which is a divisional of U.S. patent application Ser. No. 13/035,700, filed Feb. 25, 2011, issued as U.S. Pat. No. 8,759,895, all of which are incorporated herein by reference in their entirety.

STATEMENT OF JOINT RESEARCH AGREEMENT

In compliance with 37 C.F.R. § 1.71(g) (1), the inventions described and claimed herein were made pursuant to a Joint Research Agreement as set forth in 35 U.S.C. § 103(C) (Pre-AIA), and as defined in 35 § 100(h) that was in effect on or before the date such inventions were made, and as a result of activities undertaken within the scope of the Joint Research Agreement, by or on the behalf of Micron Technology, Inc. and Intel Corporation.

BACKGROUND

Non-volatile semiconductor memories (NVSMs) are widely used in many electronic devices such as personal digital assistants (PDAs), laptop computers, mobile phones and digital cameras. Some of these memories have arrays of charge storage transistors, such as floating gate transistors.

BRIEF DESCRIPTION OF THE DRAWINGS

Some embodiments are illustrated by way of example and not limitation in the figures of the accompanying drawings in which.

DETAILED DESCRIPTION

An array of charge storage devices according to various embodiments of the invention may function as an array of memory cells in a memory device such as a NOT AND (NAND) memory device.

Figure 1:
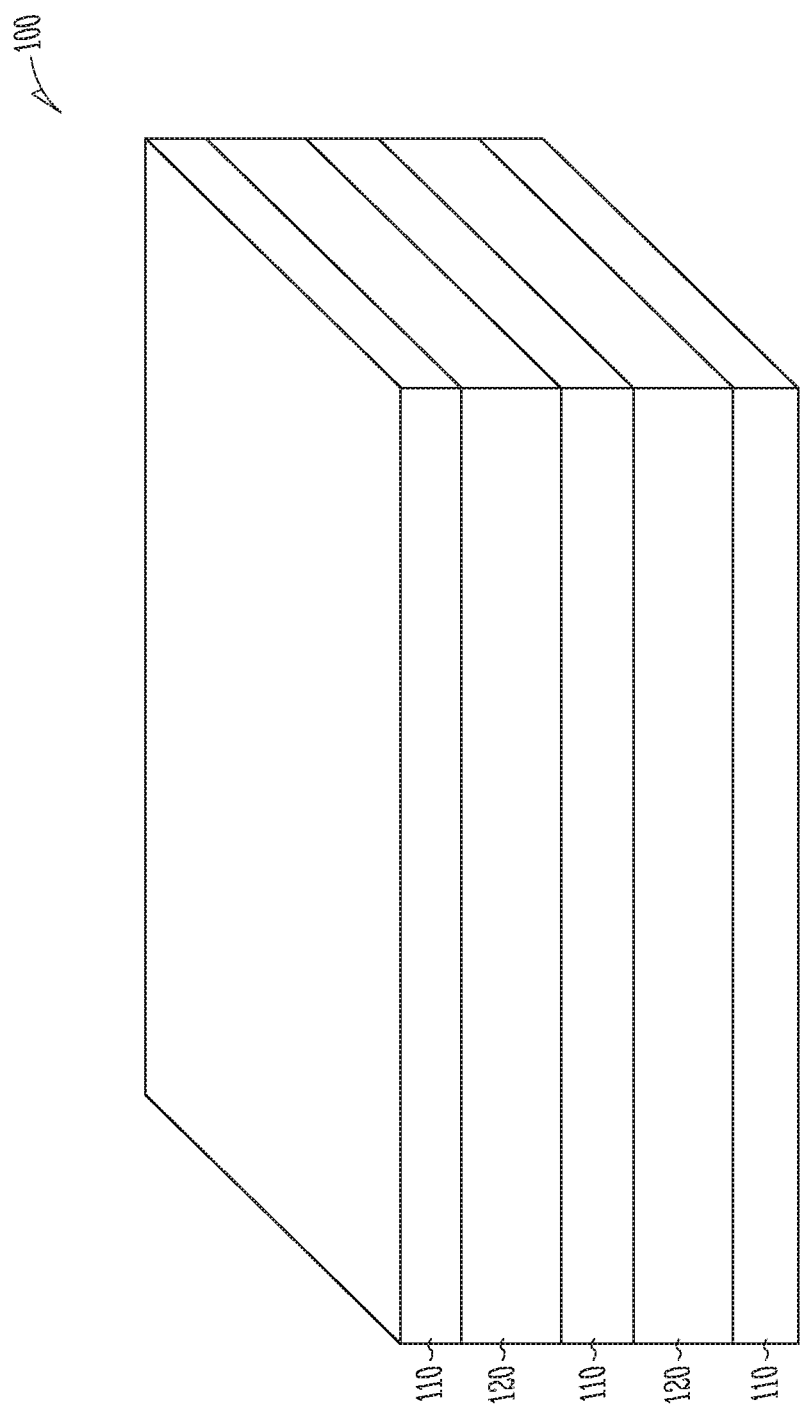
FIG. 1 is a three-dimensional view of a semiconductor construction according to various embodiments of the invention.

FIG. 1 is a three-dimensional view of a semiconductor construction 100 according to various embodiments of the invention. Tiers and regions in the semiconductor construction 100 will be identified by the same reference numerals throughout FIGS. 1-8 for purposes of brevity and clarity. An array of charge storage devices comprising thin film transistors (TFT) are to be formed in the semiconductor construction 100 as will be described herein below. The semiconductor construction 100 comprises an array of NAND strings of memory cells according to various embodiments of the invention.

The semiconductor construction 100 includes alternating tiers of a semiconductor material such as undoped polysilicon 110 and a dielectric 120. Each tier of dielectric 120 is between, and in contact with, two of the tiers of undoped polysilicon 110. The dielectrics 120 may comprise, for example, silicon dioxide (SiO2), oxynitride or nitrided oxide, according to various embodiments of the invention. A hard mask (not shown) may be formed on one of the tiers of undoped polysilicon 110 at the top of the semiconductor construction 100. The hard mask can be, for example, silicon dioxide ($SiO_2$), silicon nitride (Si3N4) or polysilicon according to various embodiments of the invention. Three tiers of the undoped polysilicon 110 and two tiers of the dielectric 120 are shown in FIG. 1, and the semiconductor construction 100 may include, for example, 8, 16, 24, 32, 40, 48 or more tiers of undoped polysilicon 110, formed alternately with tiers of dielectrics 120 according to various embodiments of the invention. P-type or n-type polysilicon may be used in the semiconductor construction 100 instead of the undoped polysilicon 110 according to various embodiments of the invention.

Figure 2:
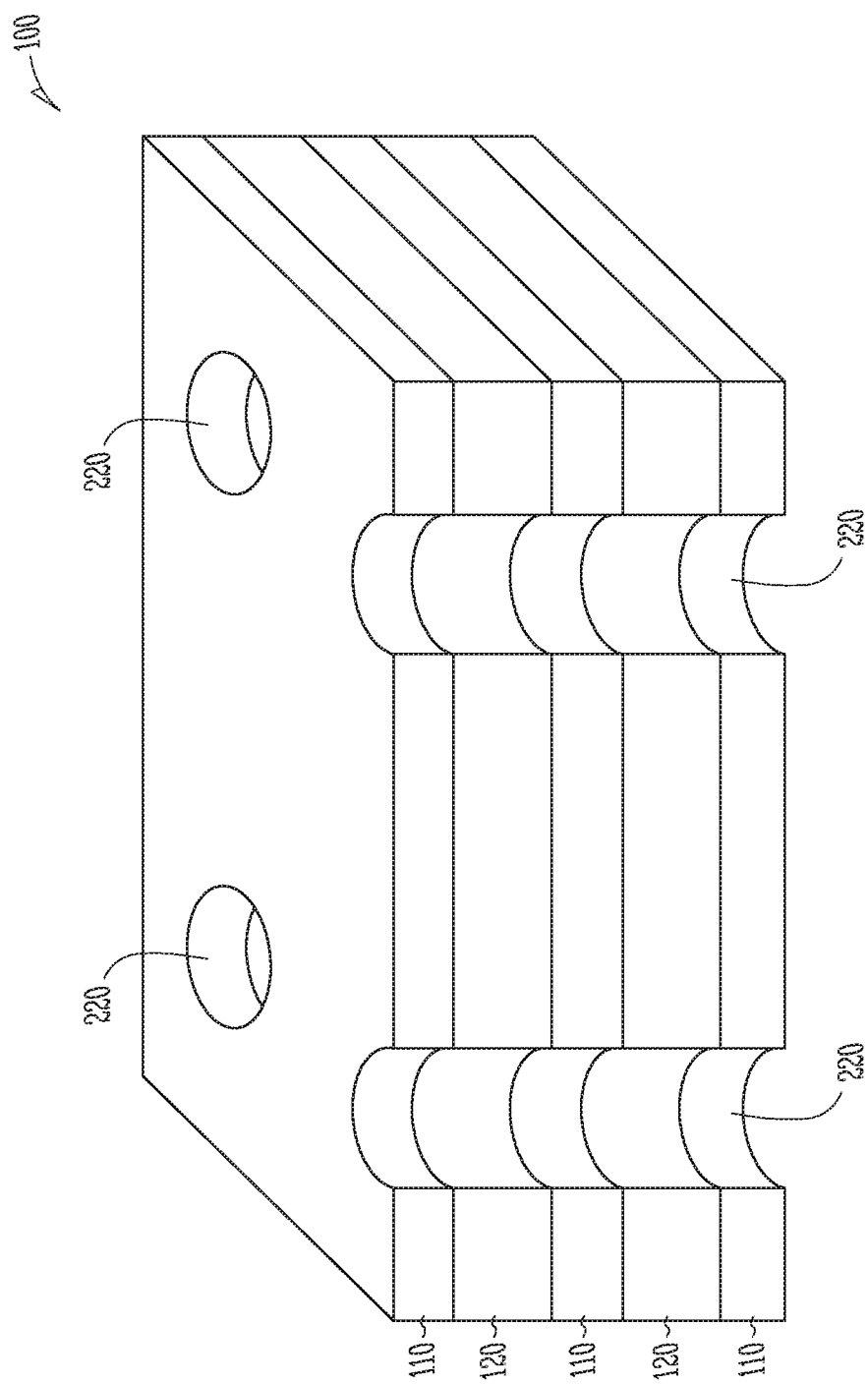
FIG. 2 is a three-dimensional view of a semiconductor construction according to various embodiments of the invention.

FIG. 2 is a three-dimensional view of the semiconductor construction 100 according to various embodiments of the invention. Openings such as holes 220 are etched into the semiconductor construction 100 through the tiers of undoped polysilicon 110 and dielectrics 120. The holes 220 may be patterned and etched through the semiconductor construction 100, such as by using a single dry etch, e.g., a reactive ion etch, according to various embodiments of the invention.

Figure 3:
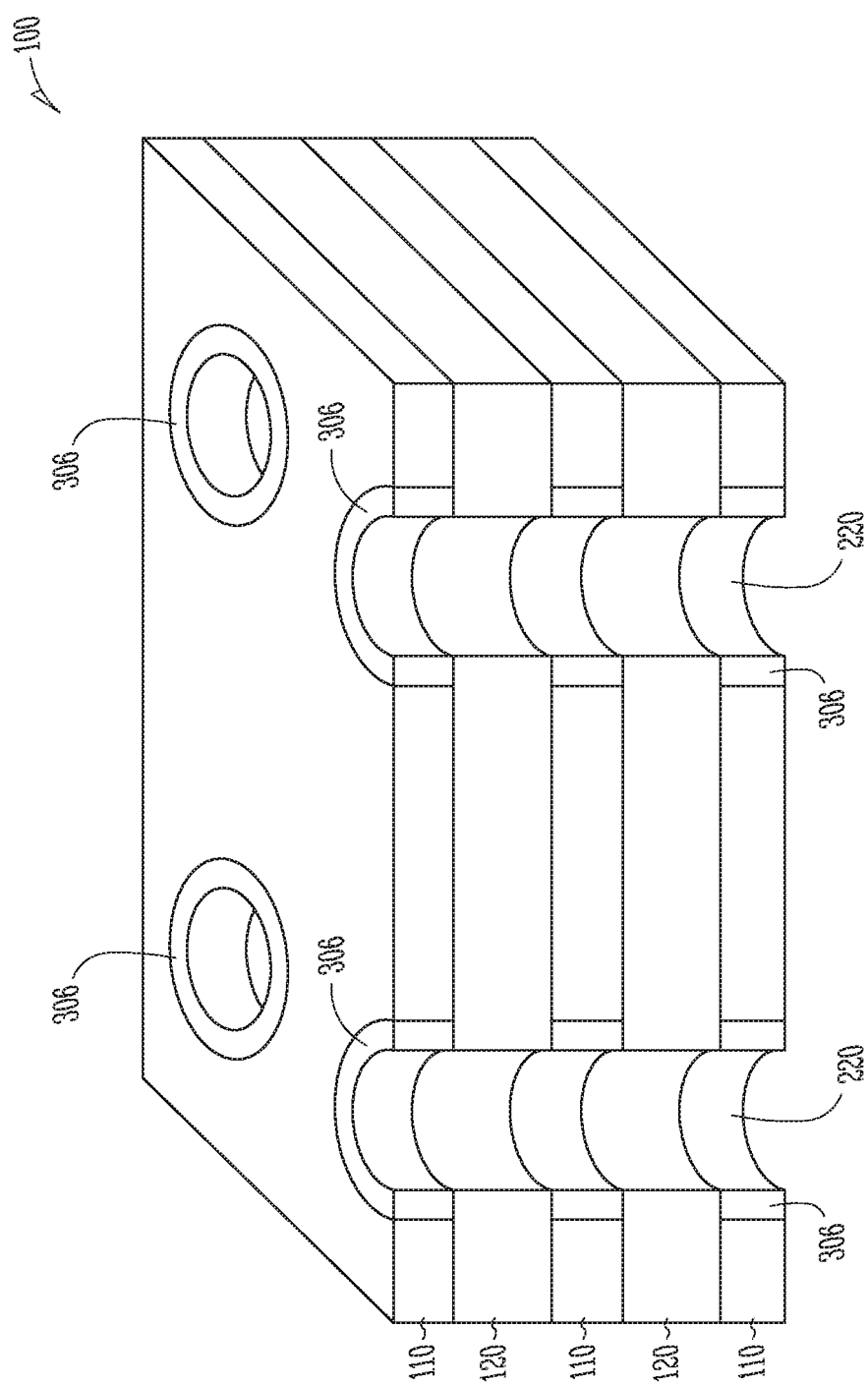
FIG. 3 is a three-dimensional view of a semiconductor construction according to various embodiments of the invention.

FIG. 3 is a three-dimensional view of the semiconductor construction 100 according to various embodiments of the invention. The semiconductor construction 100 receives a p-type dopant such as Boron. The Boron may be implanted with plasma assist deposition (PLAD), for example. Portions of undoped polysilicon 110 exposed by the holes 220 receive the Boron through the holes 220 to result in rings of p+ type polysilicon 306 that surround the holes 220. The rings of p+ type polysilicon 306 are surrounded by the portions of undoped polysilicon 110 that are not reached by the Boron. The hard mask (not shown) substantially prevents the Boron from reaching the semiconductor construction 100 underneath the hard mask. The semiconductor construction 100 may be doped with a p-type dopant other than Boron according to various embodiments of the invention.

The portions of undoped polysilicon 110 exposed by the holes 220 that receive the Boron may not be rings. Thus, the portions may only partially surround each hole 220 according to various embodiments of the invention.

Alternatively, a p-type polysilicon may be formed (e.g., deposited) as plugs in the holes 220 to enable a p-type dopant such as Boron to diffuse from the p-type polysilicon into the undoped polysilicon 110 adjacent to the holes 220. The p-type polysilicon plugs are then selectively removed from the holes 220 once the rings of p+ type polysilicon 306 have been formed. The rings of p+ type polysilicon 306 may also be formed by gas or solid phase doping according to various embodiments of the invention. The rings of p+ type polysilicon 306 may be doped to be n type or remain undoped according to various embodiments of the invention, as long as the rings of polysilicon 306 are doped differently from the remaining polysilicon that is to be selectively etched.

Figure 4:
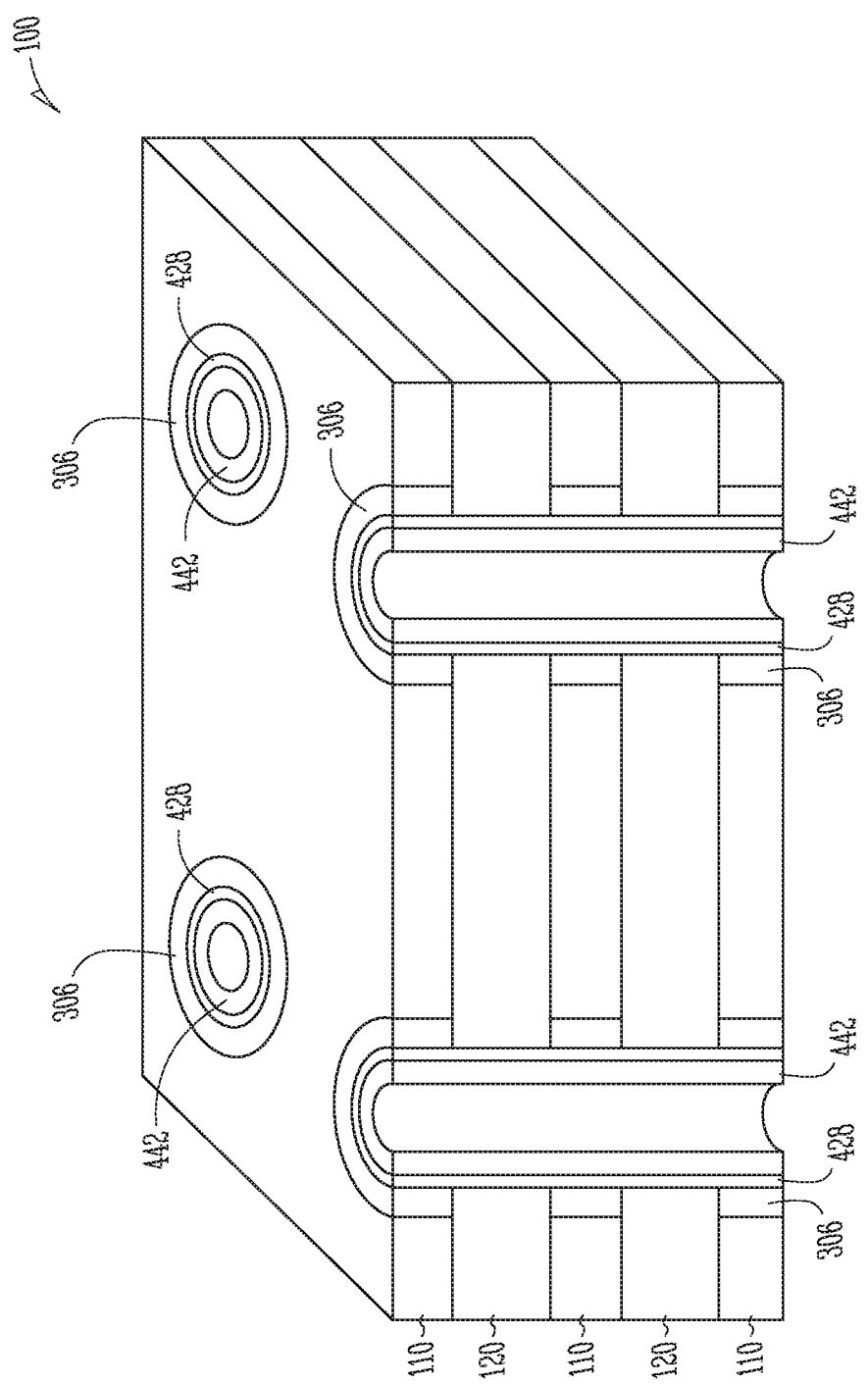
FIG. 4 is a three-dimensional view of a semiconductor construction according to various embodiments of the invention.

FIG. 4 is a three-dimensional view of the semiconductor construction 100 according to various embodiments of the invention. A tunneling dielectric 428 is formed inside the holes 220 over the dielectrics 120 and the rings of p+ type polysilicon 306. The tunneling dielectric 428 can be, for example, silicon dioxide ($SiO_2$) or silicon nitride ($Si_3N_4$), and may be deposited or grown. A thin silicon film 442 is formed (e.g., deposited) inside the holes 220 on the tunneling dielectric 428. The thin silicon film 442 has a thickness in the range of about 3 to about 15 nanometers and an outer dimension (in FIG. 4 a diameter) in the range of about 30 to about 100 nanometers. The thin silicon film 442 can be used as a channel for TFTs including the rings of p+ type polysilicon 306.

Figure 5:
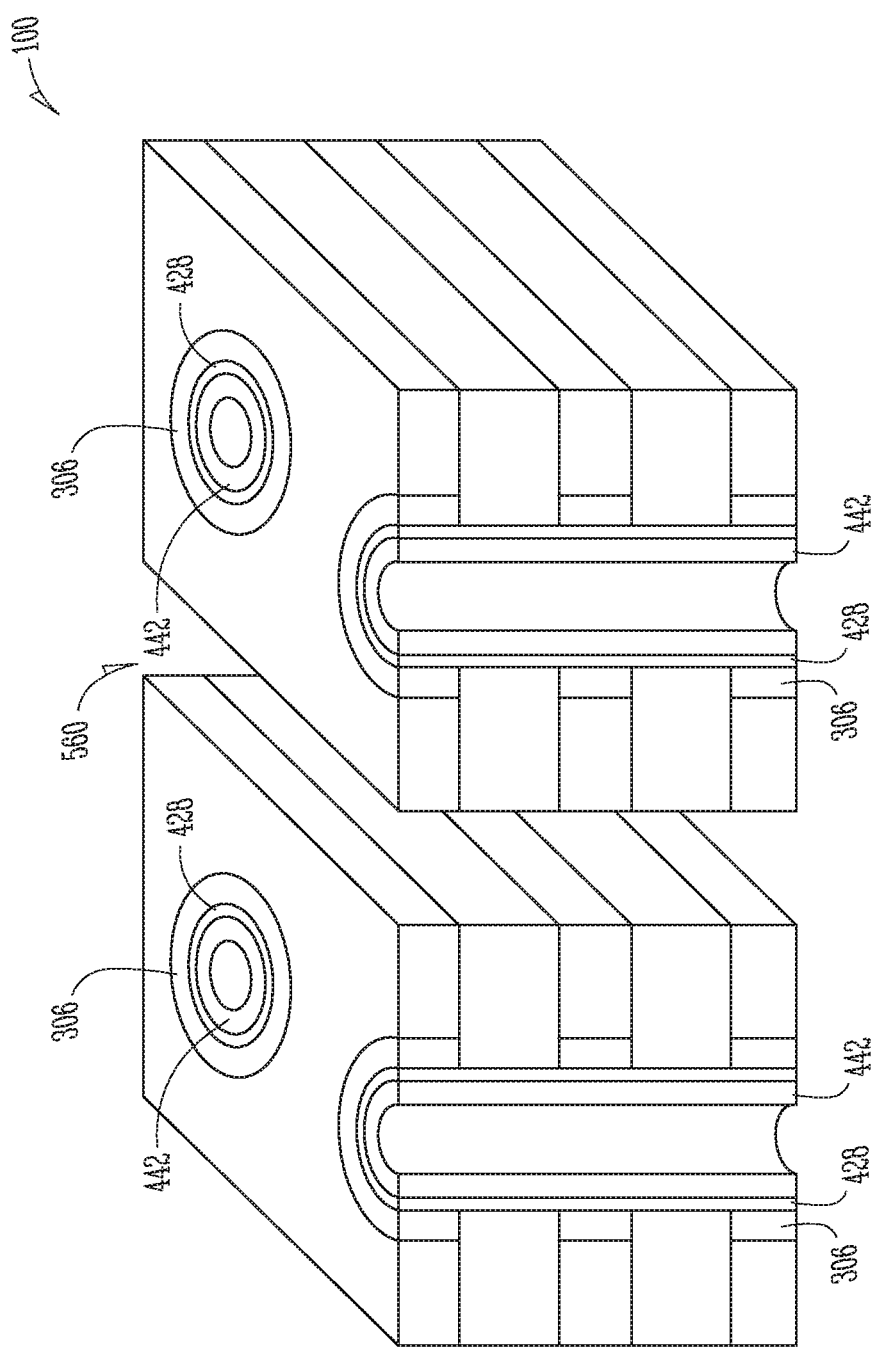
FIG. 5 is a three-dimensional view of a semiconductor construction according to various embodiments of the invention.

FIG. 5 is a three-dimensional view of the semiconductor construction 100 according to various embodiments of the invention. A vertical slot 560 can be etched through the tiers of undoped polysilicon 110 and the dielectrics 120 and between the holes 220 to divide the semiconductor construction 100. The vertical slot 560 can be patterned and etched, such as by using a single dry etch. e.g., a reactive ion etch, according to various embodiments of the invention.

Figure 6:
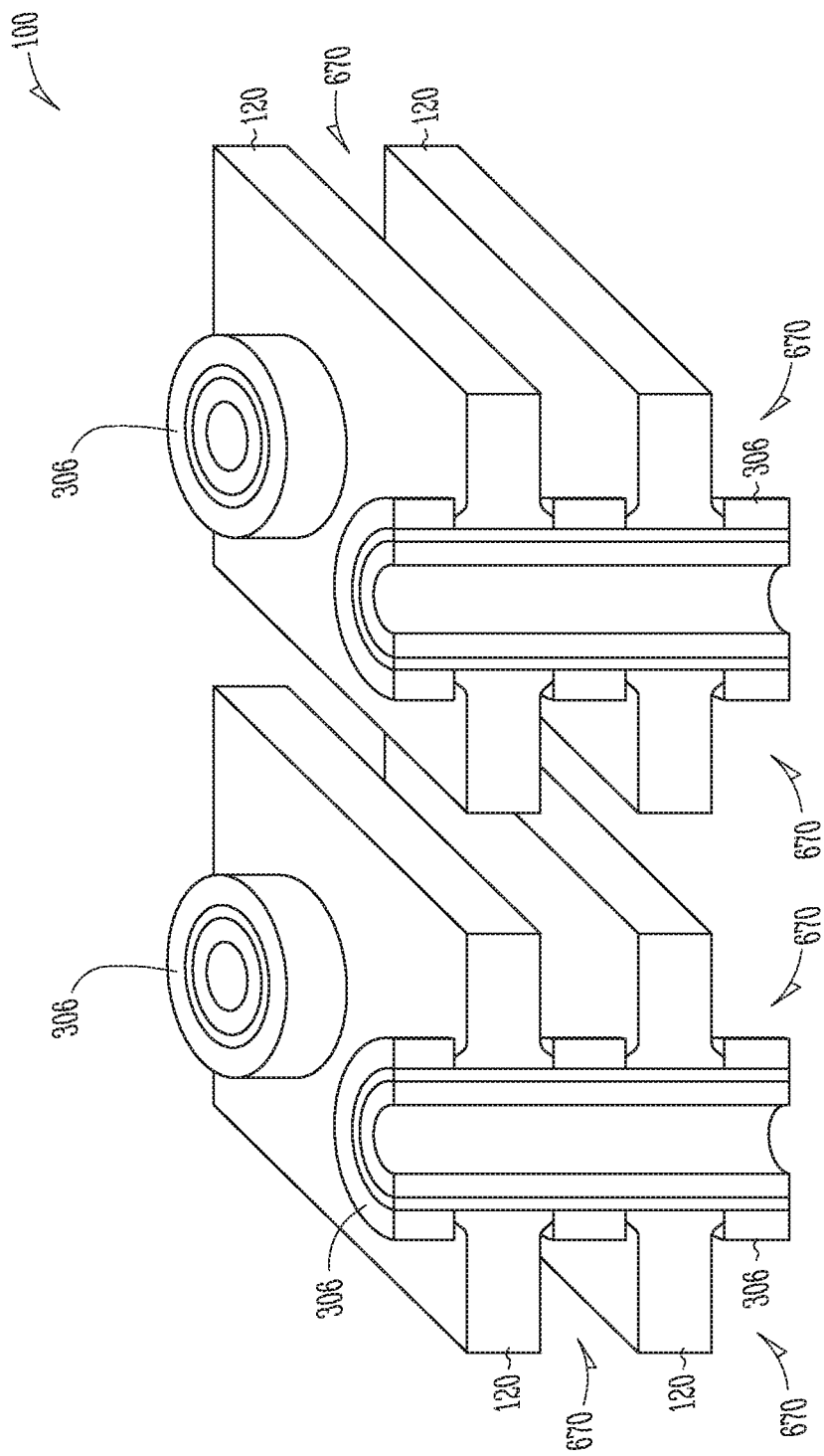
FIG. 6 is a three-dimensional view of a semiconductor construction according to various embodiments of the invention.

FIG. 6 is a three-dimensional view of the semiconductor construction 100 according to various embodiments of the invention. Portions of the undoped polysilicon 110 (e.g., at least substantially all of the undoped polysilicon 110) are removed by an etch to leave the rings of p+ type polysilicon 306 and the tiers of dielectrics 120. The undoped polysilicon 110 can be selectively removed by, for example, a Tetramethylammonium hydroxide (TMAH) etch. The hard mask (not shown) described previously remains during the TMAH etch. The rings of p+ type polysilicon 306 can be approximately 10 to 15 nanometers thick and can be used as charge storage structures, such as floating gates, in the semiconductor construction 100. Voids 670 between the tiers of dielectrics 120 formerly occupied by the undoped polysilicon 110 can be widened by a wet etch that removes portions of the dielectrics 120. The dielectrics 120 can be undercut with respect to the rings of p+ type polysilicon 306 by the wet etch such that the rings of p+ type polysilicon 306 project in an overhang from the dielectrics 120.

Figure 7:
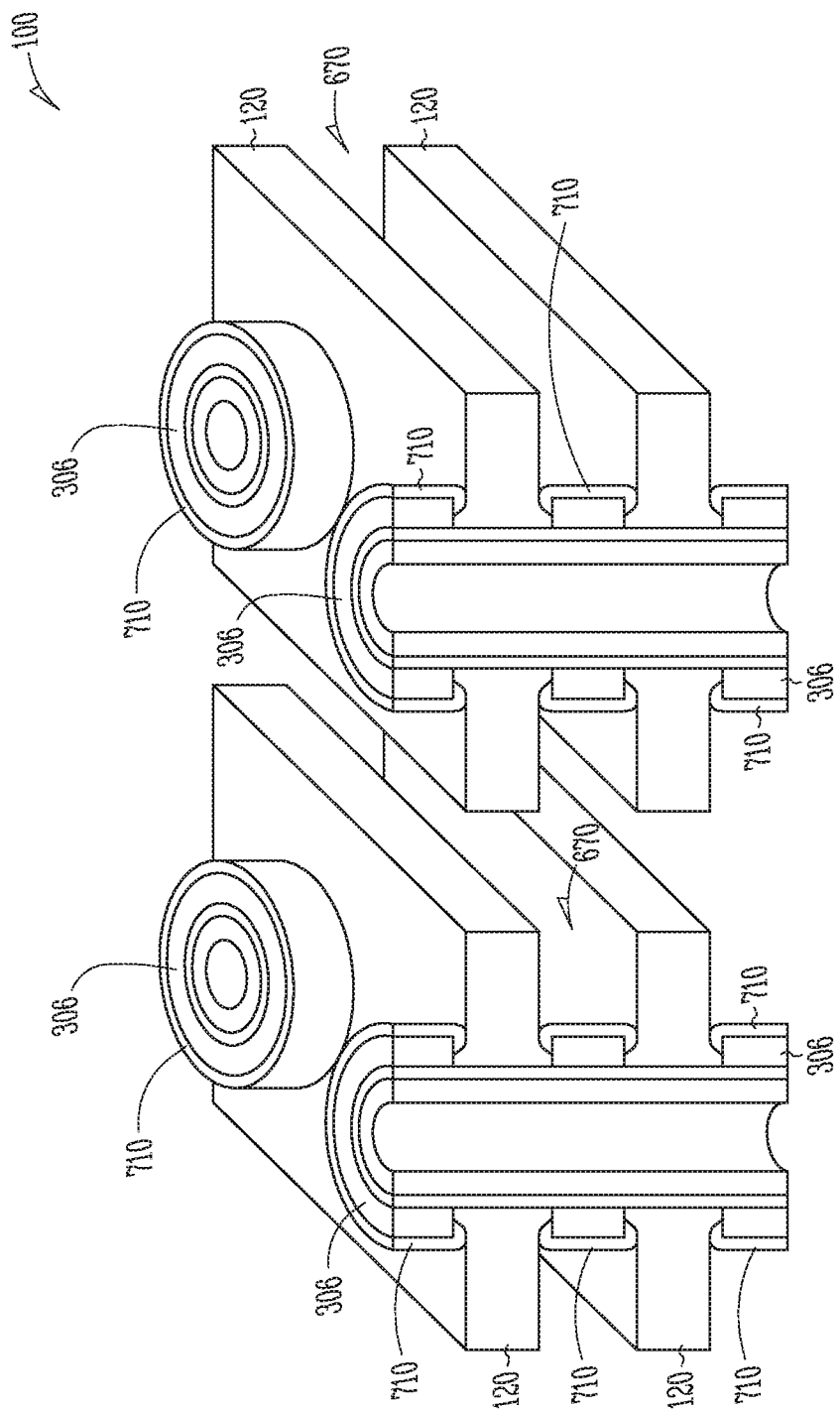
FIG. 7 is a three-dimensional view of a semiconductor construction according to various embodiments of the invention.

FIG. 7 is a three-dimensional view of the semiconductor construction 100 according to various embodiments of the invention. The widened voids 670 between the dielectrics 120 can accommodate a first inter-gate dielectric (IGD), such as a first inter-poly dielectric (IPD) layer that is formed around the rings of p+ type polysilicon 306. The dielectrics 120 may be etched by, for example, dilute hydrofluoric acid or ammonium hydroxide. The rings of p+ type polysilicon 306 can be exposed to oxygen to form silicon dioxide ($SiO_2$) 710 as the first IPD layer. The silicon dioxide ($SiO_2$) 710 can be selectively grown on the rings of p+ type polysilicon 306 up to an edge between the rings of p+ type polysilicon 306 and the dielectrics 120.

Figure 8:
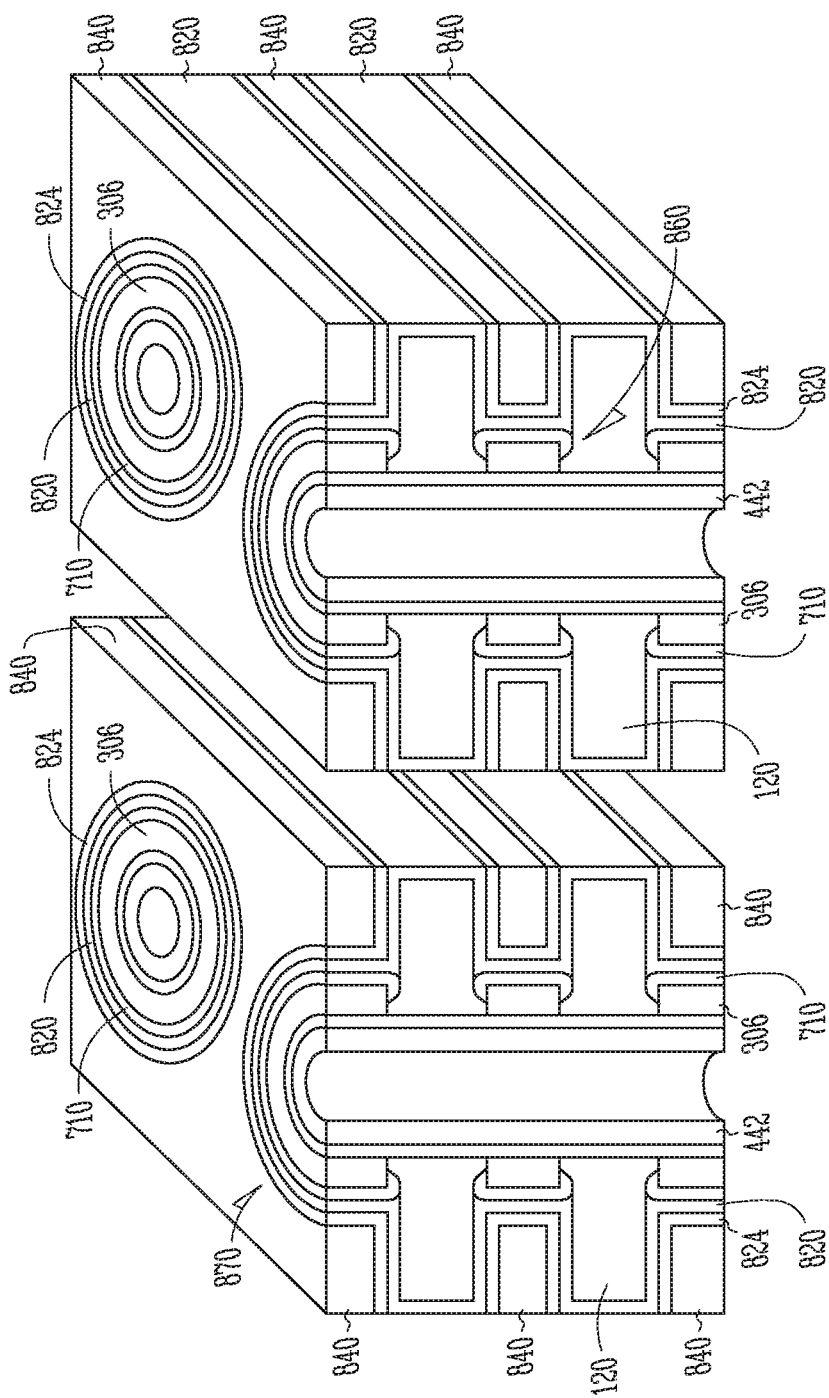
FIG. 8 is a three-dimensional view of a semiconductor construction according to various embodiments of the invention.

FIG. 8 is a three-dimensional view of the semiconductor construction 100 according to various embodiments of the invention. Silicon nitride ($Si_3N_4$) 820 can be deposited on the semiconductor construction 100 including the silicon dioxide ($SiO_2$) 710 and the dielectrics 120. Silicon dioxide ($SiO_2$) 824 can be deposited on the silicon nitride ($Si_3N_4$) 820 in the voids 670. The silicon dioxides ($SiO_2$) 710 and 824 and the silicon nitride ($Si_3N_4$) 820 together comprise an IPD of oxide-nitride-oxide ($SiO_2Si_3N_4SiO_2$ or "ONO") between the rings of p+ type polysilicon 306 and word lines 840. The IPD may alternately comprise zirconium oxide ($ZrO_x$), hafnium oxide ($HfO_x$), aluminum oxide ($AlO_x$) or titanium oxide ($TiO_x$). With respect to the word lines 840, metal can be formed (e.g., deposited) on the semiconductor construction 100 and selectively etched to form metal word lines 840 between the tiers of dielectrics 120 to fill the voids 670 such that the metal word lines 840 are substantially isolated from each other. The metal may be etched by a reactive ion etch according to various embodiments of the invention. The metal may be, for example, titanium nitride (TiN), tantalum (Ta), tantalum nitride (TaN) or Tungsten (W) according to various embodiments of the invention. The silicon dioxides ($SiO_2$) 710 and 824, the silicon nitride ($Si_3N_4$) 820 and the metal word lines 840 at least partially surround (e.g., in some cases, completely surround) the rings of p+ type polysilicon 306.

Each thin silicon film 442 in the semiconductor construction 100 can be used to provide a channel to a plurality of charge storage transistors 860 in a NAND string 870 according to various embodiments of the invention. The charge storage transistors 860 may also be called memory cells. Each charge storage transistor 860 includes at least a portion of one of the rings of p+ type polysilicon 306 that is a charge storage structure separated from the thin silicon film 442 by the tunneling dielectric 428. Each charge storage transistor 860 also includes at least a portion of one of the word lines 840 separated from the ring of p+ type polysilicon 306 by the IPD (e.g., silicon dioxides ($SiO_2$) 710 and 824 and the silicon nitride ($Si_3N_4$) 820). Access devices (not shown) are formed beneath the semiconductor construction 100 to access the charge storage transistors through the thin silicon films 442. Each NAND string is shown including three charge storage transistors 860, and four NAND strings 870 are shown in FIG. 8 that comprise an array of charge storage transistors 860 or memory cells. Each NAND string 870 may include more charge storage transistors, and the semiconductor construction 100 may include more NAND strings according to various embodiments of the invention.

Figure 9:
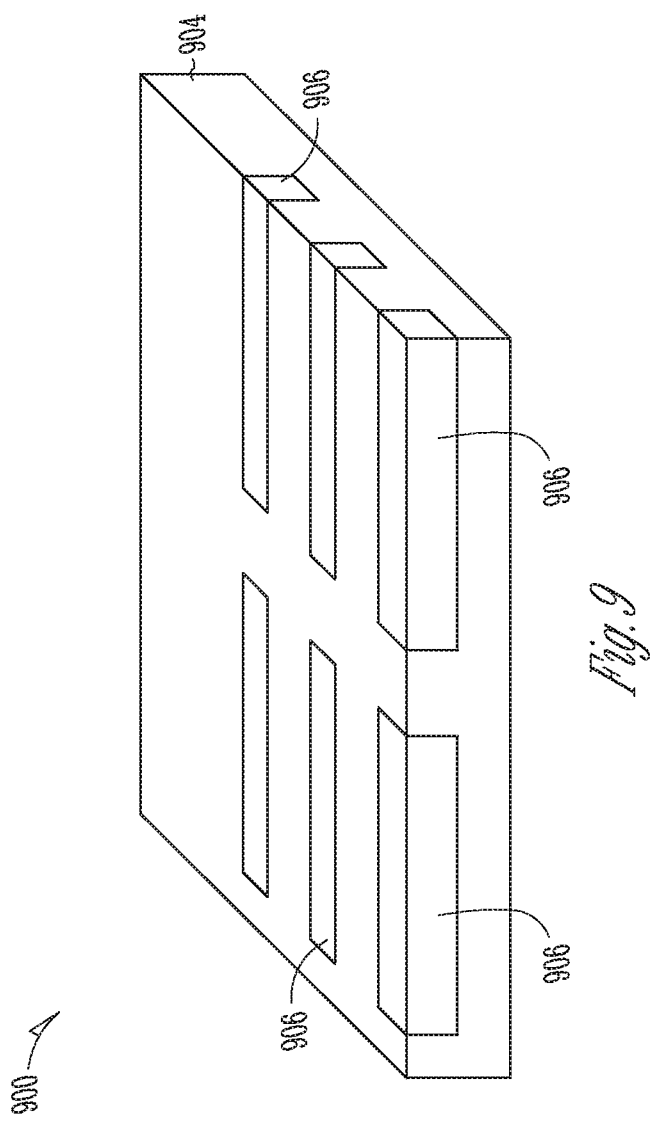
FIG. 9 is a three-dimensional view of a semiconductor construction according to various embodiments of the invention.

FIG. 9 is a three-dimensional view of a semiconductor construction 900 according to various embodiments of the invention. Tiers and regions in the semiconductor construction 900 will be identified by the same reference numerals throughout FIGS. 9-19 for purposes of brevity and clarity. An array of charge storage devices comprising TFTs are to be formed in the semiconductor construction 900 as will be described herein below. The semiconductor construction 900 comprises an array of NAND strings of memory cells according to various embodiments of the invention.

Polysilicon can be deposited to form a polysilicon base 904 of the semiconductor construction 900. Recesses are patterned and etched into the polysilicon base 904, and elongated portions of silicon nitride ($Si_3N_4$) 906 can be deposited in the recesses. The polysilicon base 904 can also be etched to clear its periphery of polysilicon. The polysilicon base 904 may be etched with a reactive ion etch according to various embodiments of the invention. The elongated portions of silicon nitride ($Si_3N_4$) 906 can be subjected to planarization such as chemical-mechanical planarization (CMP) that stops at the polysilicon base 904.

The polysilicon base 904 and the silicon nitride ($Si_3N_4$) 906 may be formed in other ways. For example, polysilicon can be deposited and then silicon nitride ($Si_3N_4$) can be deposited. The silicon nitride ($Si_3N_4$) can be patterned and etched, the etch stopping on the polysilicon. Thick polysilicon can then be deposited and subjected to planarization such as CMP that stops on the silicon nitride ($Si_3N_4$) to leave the polysilicon planar. The silicon nitride ($Si_3N_4$) 906 may be surrounded by forming additional polysilicon on the polysilicon base 904 over the silicon nitride ($Si_3N_4$) 906. Polysilicon on the periphery of the polysilicon base 904 may be removed (e.g., along with word line metal) using an etch, such as a reactive ion etch, according to various embodiments of the invention.

Figure 10:
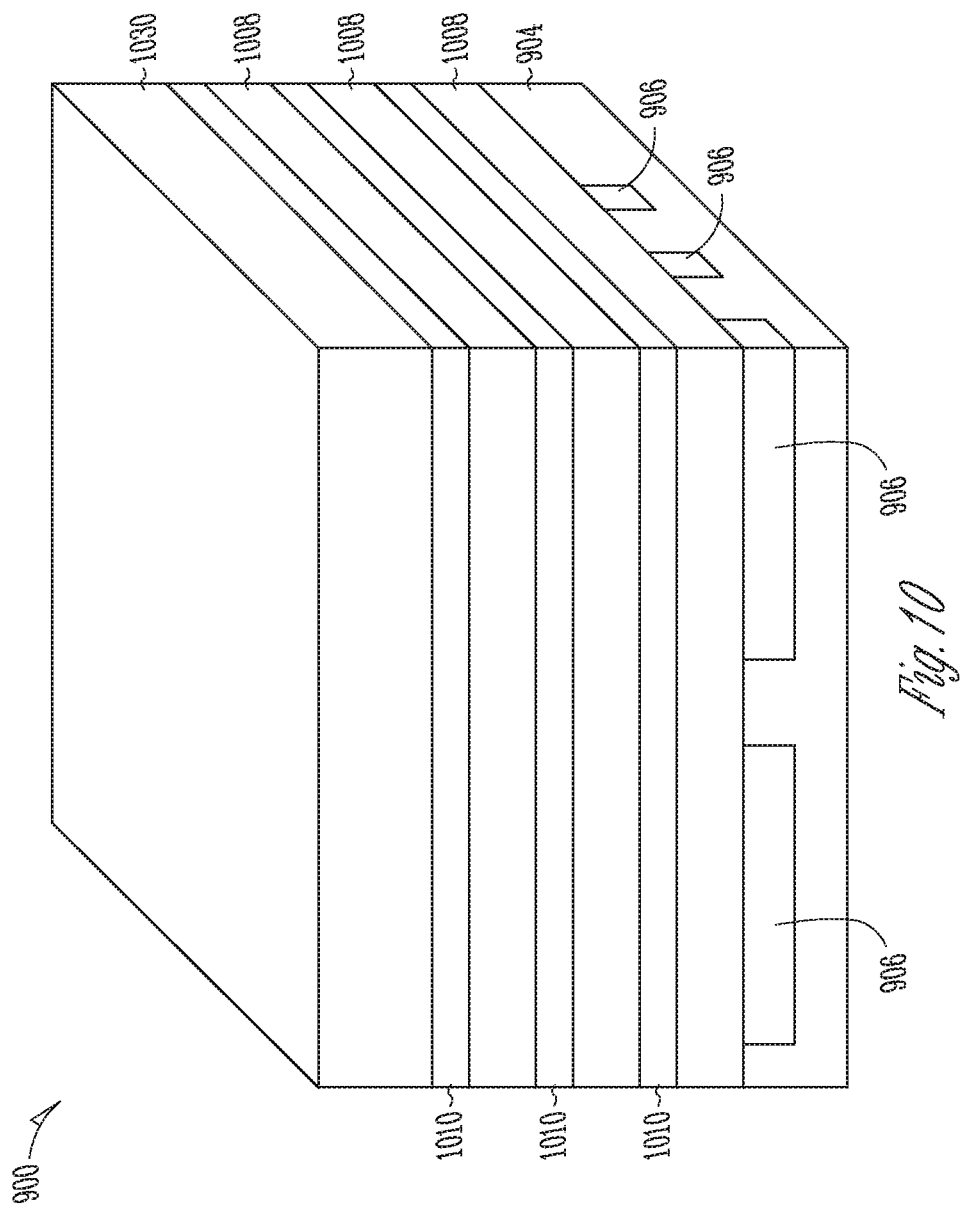
FIG. 10 is a three-dimensional view of a semiconductor construction according to various embodiments of the invention.

FIG. 10 is a three-dimensional view of the semiconductor construction 900 according to various embodiments of the invention. Alternating tiers of a semiconductor material, such as undoped polysilicon 1010, and a dielectric 1008 are formed on the polysilicon base 904 such that each dielectric 1008 is between, and in contact with, two of the tiers of undoped polysilicon 1010 or the polysilicon base 904 and the undoped polysilicon 1010. The dielectrics 1008 may comprise, for example, silicon dioxide ($SiO_2$), oxynitride or nitrided oxide, according to various embodiments of the invention. A hard mask 1030 is formed on one of the tiers of undoped polysilicon 1010 at the top of the semiconductor construction 900. The hard mask 1030 can be, for example, silicon dioxide ($SiO_2$), silicon nitride ($Si_3N_4$) or polysilicon. Three tiers of undoped polysilicon 1010 and dielectrics 1008 are shown in FIG. 10, however the semiconductor construction 900 may include, for example, 8, 16, 24, 32, 40, 48 or more tiers of undoped polysilicon 1010 formed alternately with the dielectrics 1008 according to various embodiments of the invention. P-type or n-type polysilicon may be used in the semiconductor construction 100 instead of the undoped polysilicon 1010 according to various embodiments of the invention.

Figure 11:
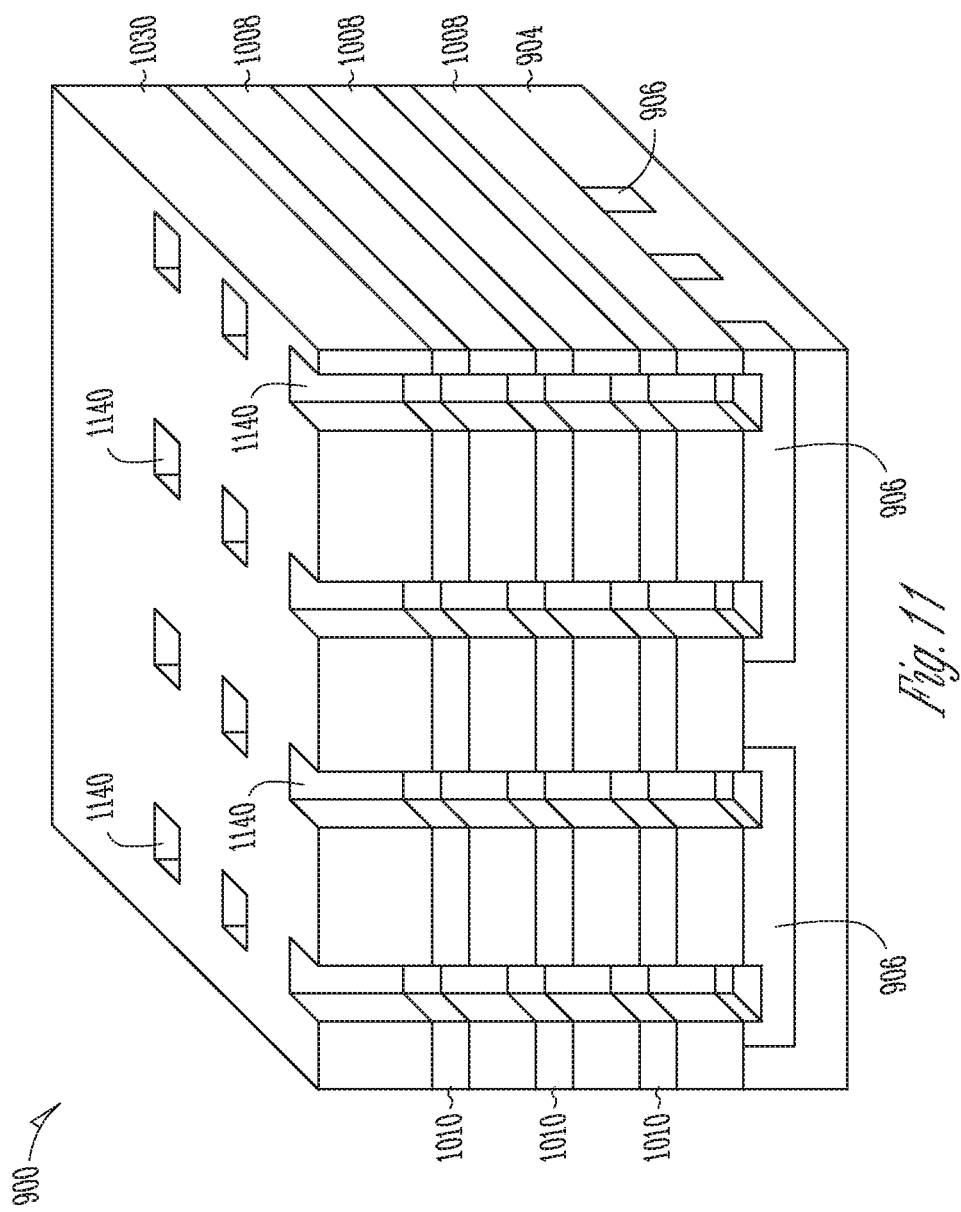
FIG. 11 is a three-dimensional view of a semiconductor construction according to various embodiments of the invention.

FIG. 11 is a three-dimensional view of the semiconductor construction 900 according to various embodiments of the invention. Openings such as holes 1140 are patterned and etched in the semiconductor construction 900. The holes 1140 are patterned to be aligned with ends of the elongated portions of silicon nitride 906. The holes 1140 are etched through the hard mask 1030, the tiers of undoped polysilicon 1010 and dielectrics 1008, stopping in the elongated portions of silicon nitride 906. Two of the holes 1140 extend into respective ends of each one of the elongated portions of silicon nitride 906, one hole 1140 at either end, such that each elongated portion of silicon nitride 906 extends between two of the holes 1140. The holes 1140 are illustrated as being substantially square but may be substantially circular or substantially oval or may have any suitable geometry. The holes 1140 are etched, such as by using a single dry etch, e.g., a reactive ion etch, according to various embodiments of the invention.

Figure 12:
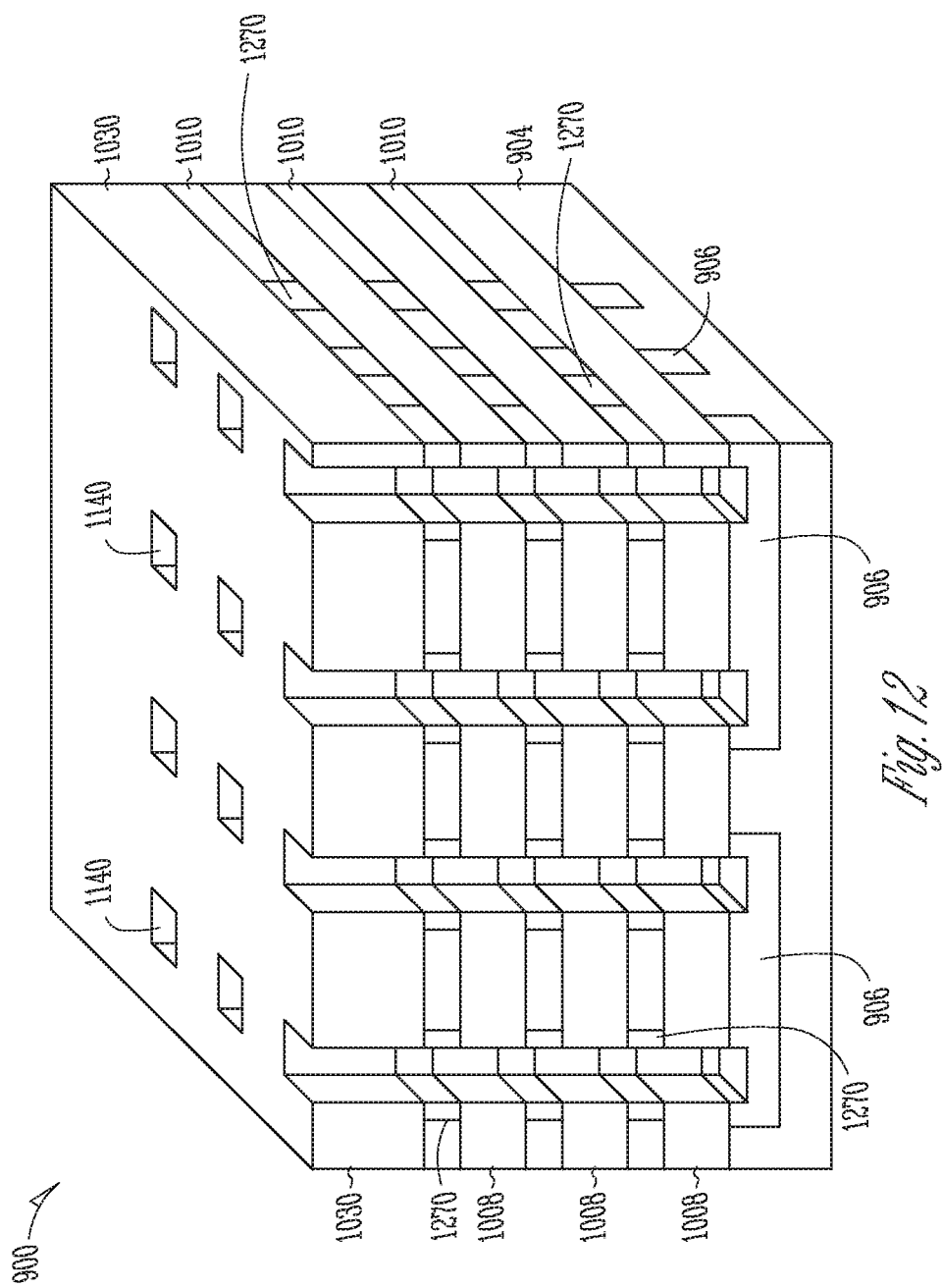
FIG. 12 is a three-dimensional view of a semiconductor construction according to various embodiments of the invention.

FIG. 12 is a three-dimensional view of the semiconductor construction 900 according to various embodiments of the invention. The semiconductor construction 900 receives a p-type dopant such as Boron. The Boron may be implanted with PLAD, for example. The portions of undoped polysilicon 1010 exposed by the holes 1140 receive the Boron to result in rings of p+ type polysilicon 1270 around the holes 1140. The rings of p+ type polysilicon 1270 are surrounded by the portions of undoped polysilicon 1010 that are not reached by the Boron. The rings of p+ type polysilicon 1270 have a square shape because the holes 1140 are square. Thus, the rings 1270 will generally have a shape conforming to the geometry of the holes 1140. The hard mask 1030 substantially prevents the Boron from reaching the semiconductor construction 900 underneath the hard mask 1030. The semiconductor construction 900 may be doped with a p-type dopant other than Boron according to various embodiments of the invention.

Alternatively, a p-type polysilicon may be formed (e.g., deposited) as plugs in the holes 1140 to enable a p-type dopant such as Boron to diffuse from the p-type polysilicon into the undoped polysilicon 1010 adjacent to the holes 1140. The p-type polysilicon plugs are then selectively removed from the holes 1140 once the rings of p+ type polysilicon 1270 have been formed. The rings of p+ type polysilicon 1270 may also be formed by gas or solid phase doping according to various embodiments of the invention. The rings of p+ type polysilicon 1270 may be doped to be n type or remain undoped according to various embodiments of the invention, as long as the rings of polysilicon 1270 are doped differently from the remaining polysilicon that is to be selectively etched.

The portions of undoped polysilicon 1010 exposed by the holes 1140 that receive the Boron may be portions of p+ type polysilicon that are not rings, such that the portions only partially surround each hole 1140 according to various embodiments of the invention.

Figure 13:
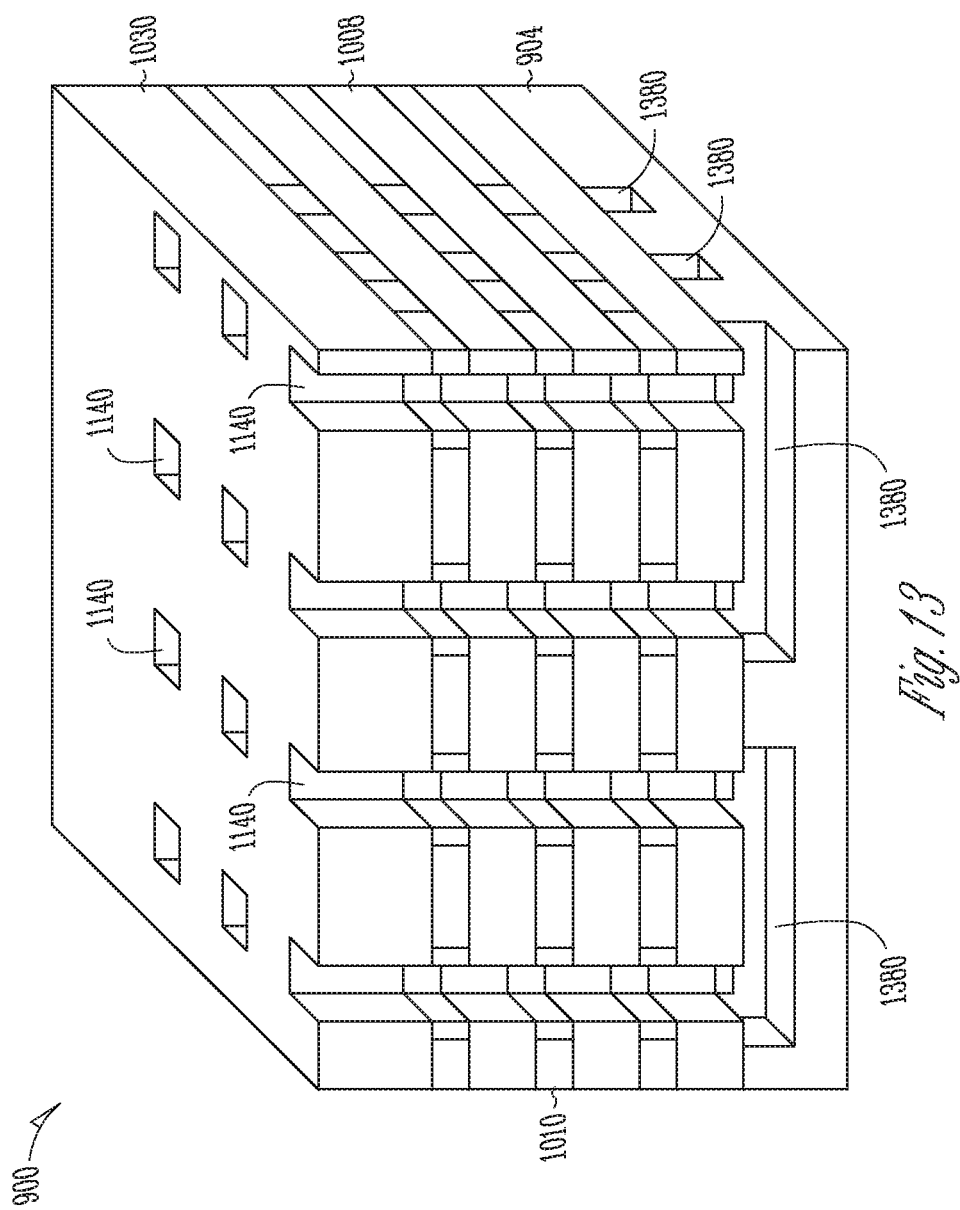
FIG. 13 is a three-dimensional view of a semiconductor construction according to various embodiments of the invention.

FIG. 13 is a three-dimensional view of the semiconductor construction 900 according to various embodiments of the invention. The elongated portions of silicon nitride 906 are selectively removed through the holes 1140 with a wet nitrate strip (WNS). The removal of the elongated portions of silicon nitride 906 leave elongated cavities in the polysilicon base 904. Each elongated cavity is open to two of the holes 1140, one hole 1140 at each end to form U-shaped pipes 1380 in the semiconductor construction 900. Each U-shaped pipe 1380 is an opening that includes one of the holes 1140 through the hard mask 1030, the tiers of undoped polysilicon 1010 and dielectrics 1008, the cavity left by the elongated portion of silicon nitride 906 that was removed, and a second one of the holes 1140 through the tiers of undoped polysilicon 1010 and dielectrics 1008 and the hard mask 1030. Six U-shaped pipes 1380 are shown in FIG. 13, but a greater or lesser number of U-shaped pipes 1380 may be formed in the semiconductor construction 900 according to various embodiments of the invention.

Figure 14:
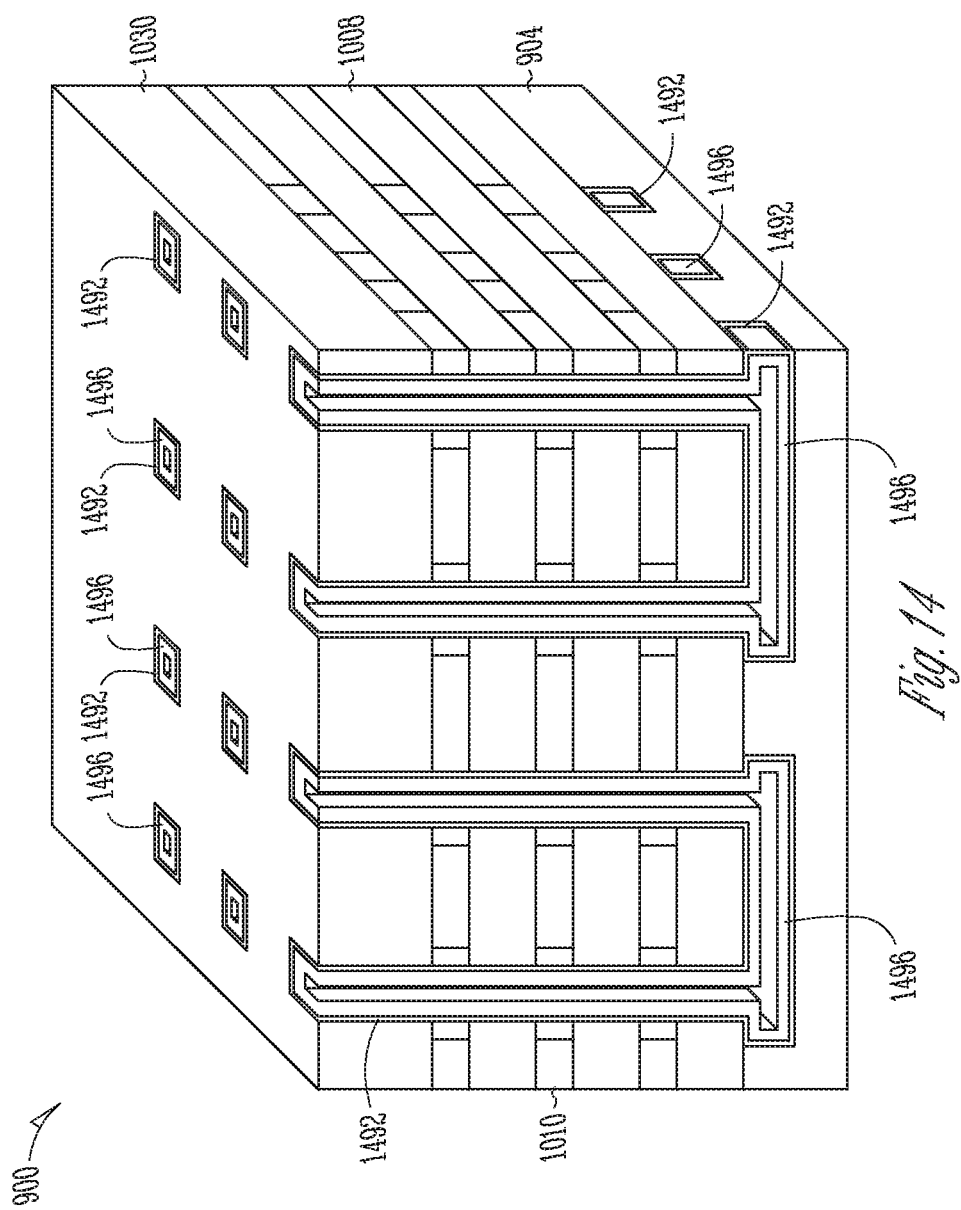
FIG. 14 is a three-dimensional view of a semiconductor construction according to various embodiments of the invention.

FIG. 14 is a three-dimensional view of the semiconductor construction 900 according to various embodiments of the invention. A tunneling dielectric 1492 is formed inside the U-shaped pipes 1380 on the hard mask 1030, the dielectrics 1008 and the rings of p+ type polysilicon 1270. The tunneling dielectric 1492 can be, for example, silicon dioxide ($SiO_2$) or silicon nitride ($Si_3N_4$), and may be deposited or grown according to various embodiments of the invention. A thin silicon film is formed (e.g., deposited) inside the U-shaped pipes 1380 on the tunneling dielectric 1492. The thin silicon film in each U-shaped pipe 1380 provides a U-shaped pipe channel 1496. The thin silicon film has a thickness in the range of about 3 to about 15 nanometers such that the U-shaped pipe channel 1496 has a thickness in the range of about 3 to about 15 nanometers and an outer dimension in the range of 30 to 100 nanometers. The semiconductor construction 900 is subjected to planarization such as CMP to remove excess portions of the U-shaped pipe channel 1496.

Figure 15:
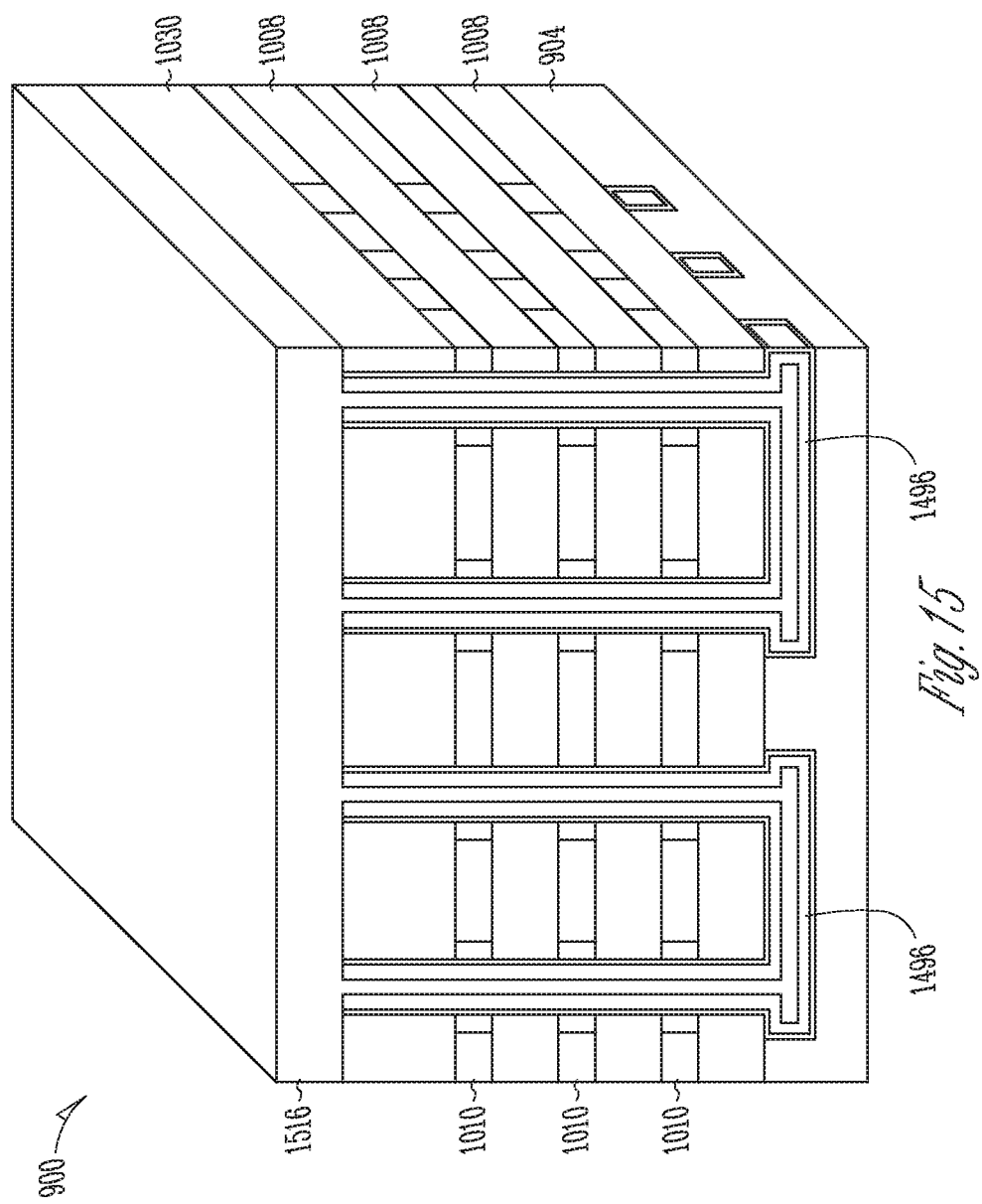
FIG. 15 is a three-dimensional view of a semiconductor construction according to various embodiments of the invention.

FIG. 15 is a three-dimensional view of the semiconductor construction 900 according to various embodiments of the invention. A silicon dioxide ($SiO_2$) mask 1516 is formed on the semiconductor construction 900 to cover the hard mask 1030 and the U-shaped pipe channels 1496. The semiconductor construction 900 can, for example, be exposed to Tetraethyl orthosilicate (TEOS) at a high temperature to form the silicon dioxide ($SiO_2$) mask 1516.

Figure 16:
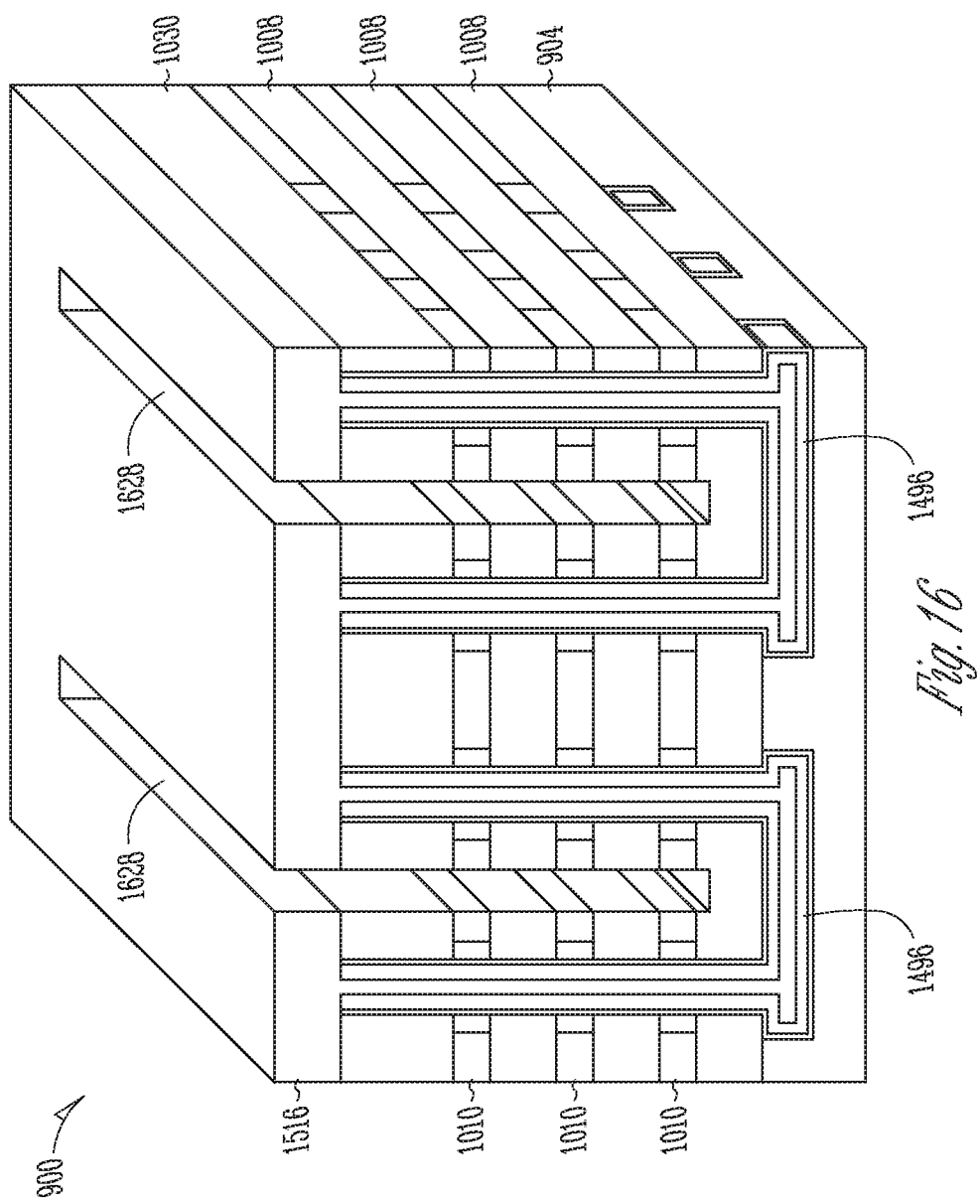
FIG. 16 is a three-dimensional view of a semiconductor construction according to various embodiments of the invention.

FIG. 16 is a three-dimensional view of the semiconductor construction 900 according to various embodiments of the invention. Vertical slots 1628 are etched in the semiconductor construction 900 through the mask 1516, the hard mask 1030, and the tiers of undoped polysilicon 1010 and dielectrics 1008. The vertical slots 1628 are etched between the holes 1140 of the U-shaped pipe channels 1496 and end in the dielectric 1008 just above the polysilicon base 904 such that the U-shaped pipe channels 1496 are not breached by the vertical slots 1628. Each vertical slot 1628 is shown as being etched between the holes 1140 of the three depicted U-shaped pipe channels 1496, however each vertical slot 1628 may be etched between the holes of one or more U-shaped pipe channels in the semiconductor construction 900 according to various embodiments of the invention. The vertical slots 1628 are patterned and etched through the semiconductor construction 900, such as by using a single dry etch, e.g., a reactive ion etch, according to various embodiments of the invention.

Figure 17:
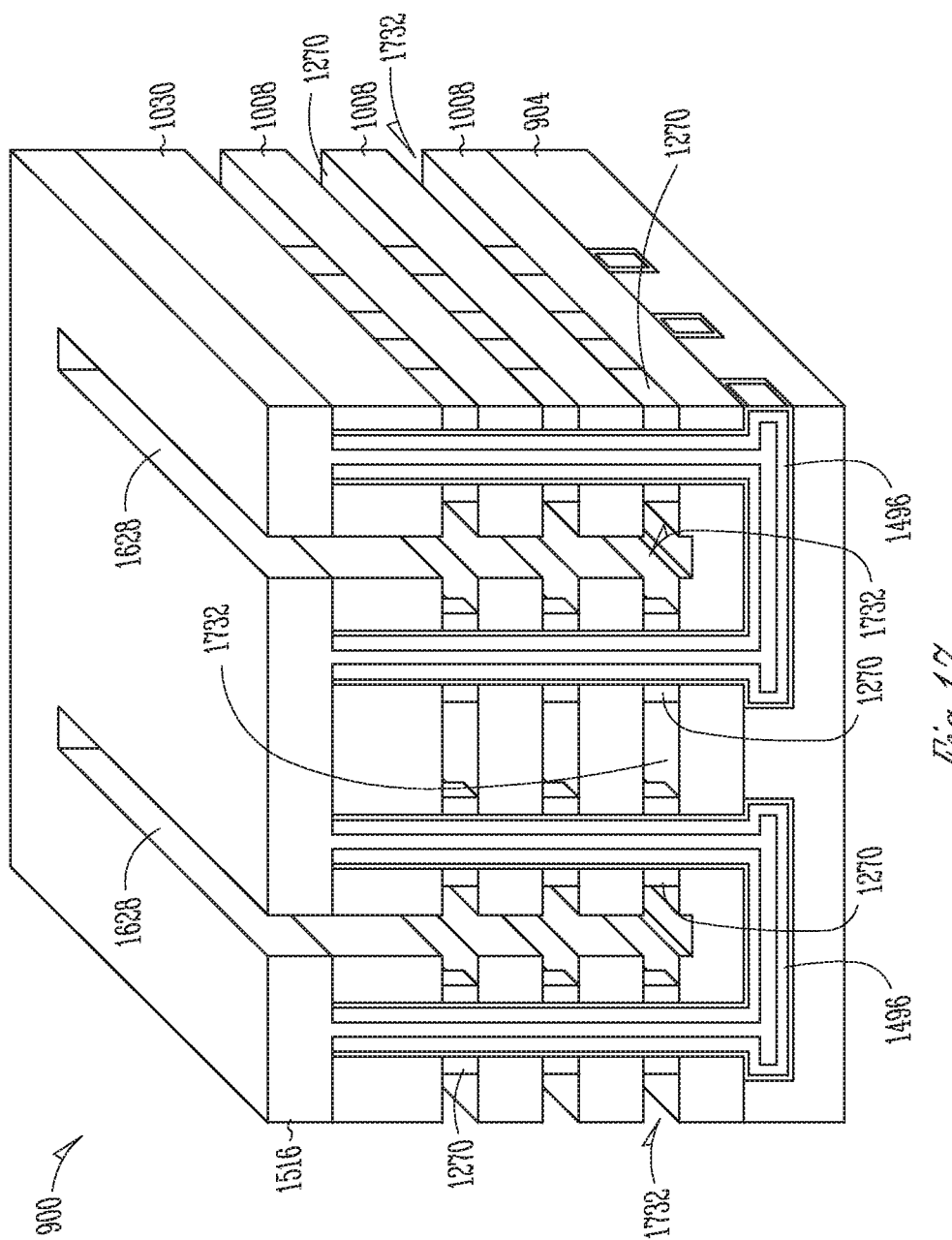
FIG. 17 is a three-dimensional view of a semiconductor construction according to various embodiments of the invention.

FIG. 17 is a three-dimensional view of the semiconductor construction 900 according to various embodiments of the invention. At least substantially all of the remaining portions of undoped polysilicon 1010 are removed by an etch to leave the rings of p+ type polysilicon 1270 and the tiers of dielectrics 1008. The portions of undoped polysilicon 1010 can be selectively removed by a TMAH etch according to various embodiments of the invention. The hard mask 1030 and the mask 1516 remain during the TMAH etch. The rings of p+ type polysilicon 1270 can be approximately 10 to 15 nanometers thick and can be used as charge storage structures, such as floating gates, in the semiconductor construction 900. According to various embodiments of the invention, portions of the p+ type polysilicon that are to be the charge storage structures may not be complete rings; thus, partial rings may be formed to partially surround each hole 1140. Voids 1732 between the tiers of dielectrics 1008 formerly occupied by the undoped polysilicon 1010 can be widened by a wet etch that removes portions of the dielectrics 1008. The dielectrics 1008 can be undercut with respect to the rings of p+ type polysilicon 1270 by the wet etch such that the rings of p+ type polysilicon 1270 project from the dielectrics 1008.

Figure 18:
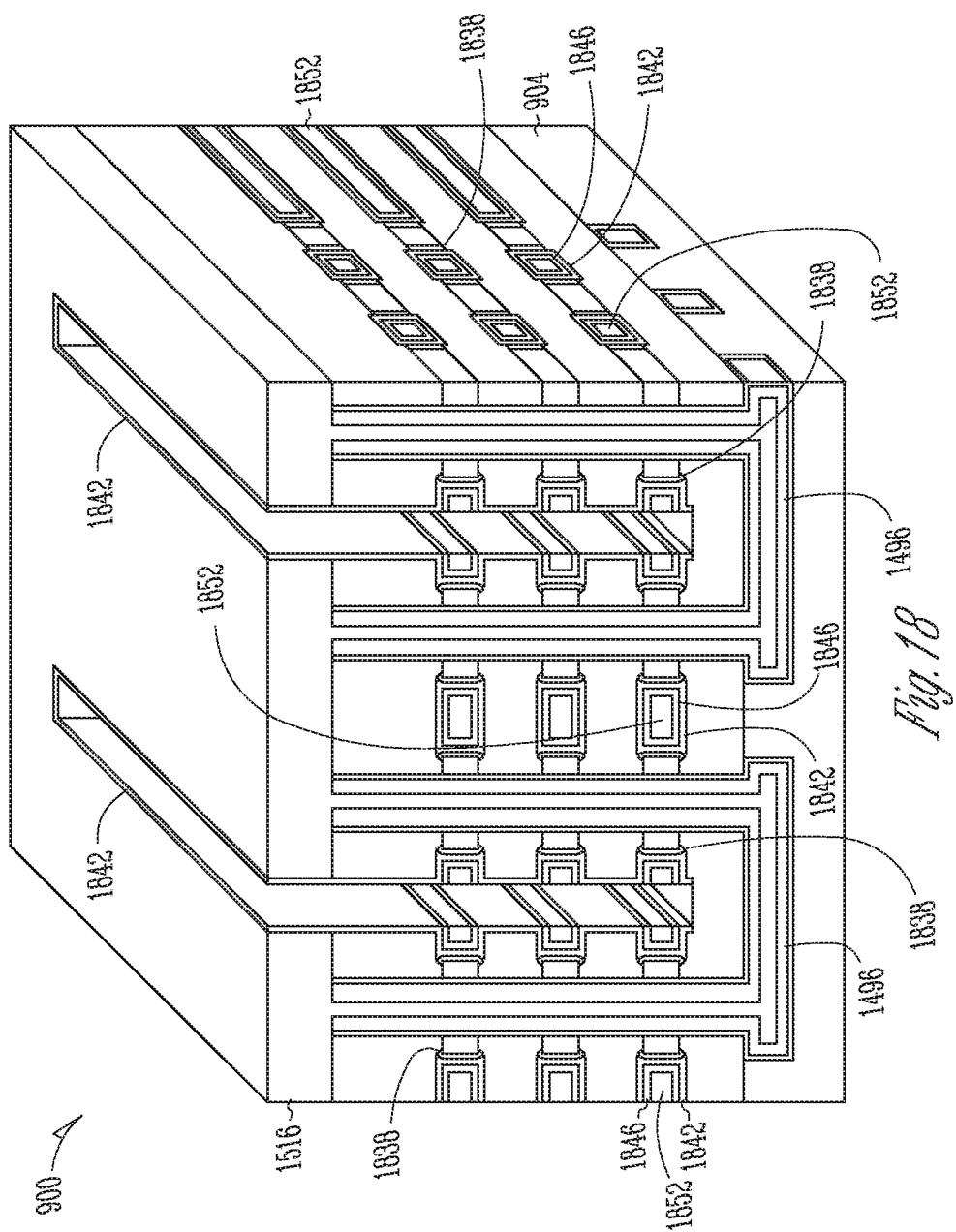
FIG. 18 is a three-dimensional view of a semiconductor construction according to various embodiments of the invention.

FIG. 18 is a three-dimensional view of the semiconductor construction 900 according to various embodiments of the invention. The widened voids 1732 between the dielectrics 1008 (shown in FIG. 17) can accommodate IPDs. The dielectrics 1008 may be etched by, for example, dilute hydrofluoric acid or ammonium hydroxide. The rings of p+ type polysilicon 1270 can be exposed to oxygen to form silicon dioxide ($SiO_2$) 1838. The silicon dioxide ($SiO_2$) 1838 can be grown on the rings of p+ type polysilicon 1270 up to an edge between the rings of p+ type polysilicon 1270 and the dielectrics 120. Silicon nitride ($Si_3N_4$) 1842 can be deposited on the semiconductor construction 900 including the silicon dioxide ($SiO_2$) 1838, the mask 1516, the hard mask 1030, and the dielectrics 1008 exposed by the vertical slots 1628. Silicon dioxide (SiO2) 1846 can then be deposited on the silicon nitride (Si3N4) 1842 in the voids 1732. The silicon dioxides ($SiO_2$) 1838 and 1846 and the silicon nitride ($Si_3N_4$) 1842 together comprise an IPD of ONO between the rings of p+ type polysilicon 1270 and word lines 1852. With respect to word lines 1852, metal can be formed (e.g., deposited) between the dielectrics 1008 covered by the IPD including the silicon dioxides ($SiO_2$) 1838 and 1846 and the silicon nitride ($Si_3N_4$) 1842 to fill the voids 1732. The metal may be, for example titanium nitride (TiN), tantalum (Ta) or Tungsten (W) according to various embodiments of the invention. The metal is selectively etched to form metal word lines 1852 in the voids 1732 that are substantially isolated from each other. The metal may be etched by, for example, a reactive ion etch. The silicon dioxides ($SiO_2$) 1838 and 1846, the silicon nitride ($Si_3N_4$) 1842 and the metal word lines 1852 at least partially surround (e.g., in some cases, completely surround) the rings of p+ type polysilicon 1270.

Figure 19:
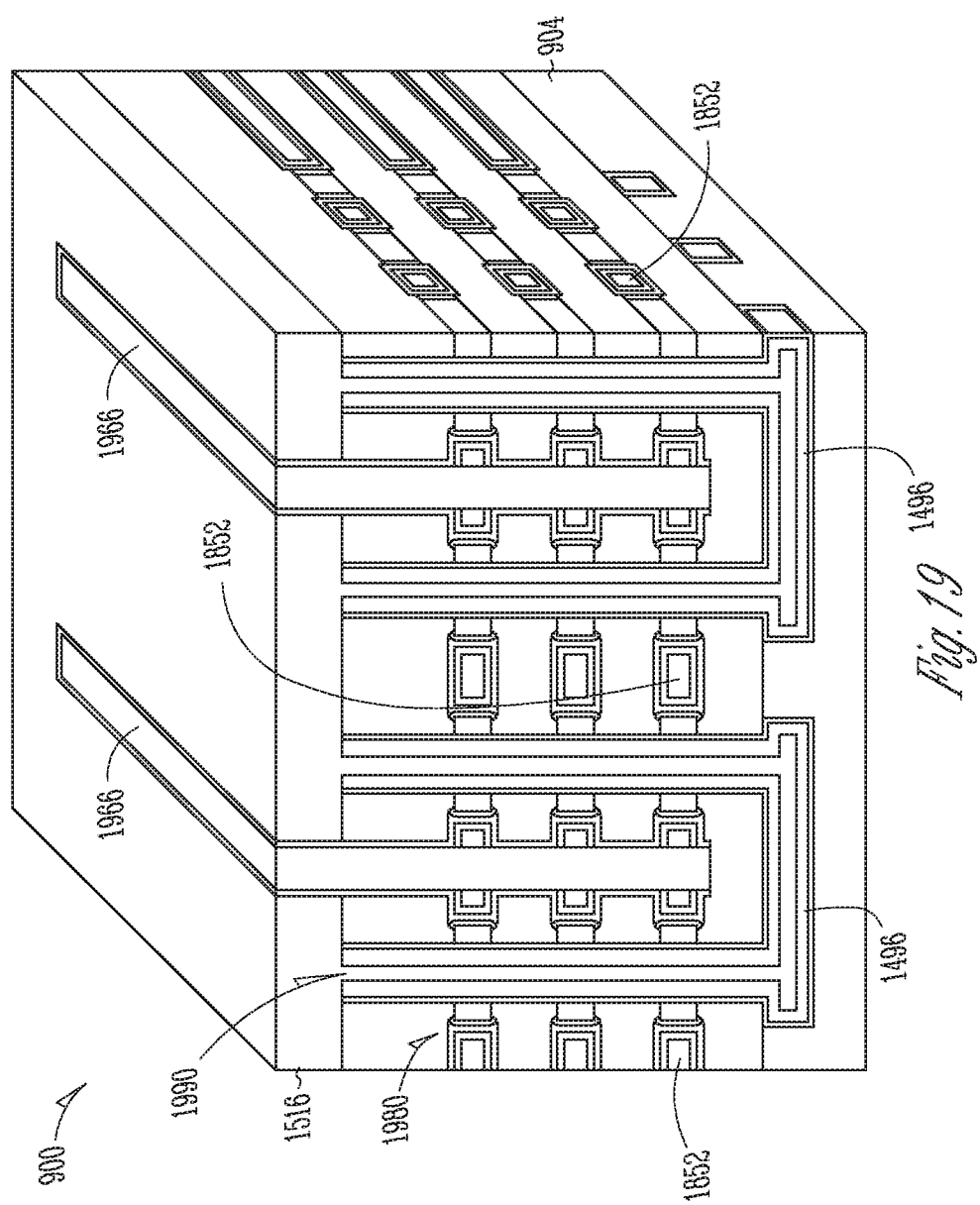
FIG. 19 is a three-dimensional view of a semiconductor construction according to various embodiments of the invention.

FIG. 19 is a three-dimensional view of the semiconductor construction 900 according to various embodiments of the invention. The vertical slots 1628 are filled with a dielectric 1966 such as, for example, silicon dioxide (SiO2). Interior space in the U-shaped pipe channels 1496 may comprise an air gap or may be filled with polysilicon or a dielectric such as, for example, silicon dioxide ($SiO_2$).

Each U-shaped pipe channel 1496 in the semiconductor construction 900 can provide a channel for a plurality of charge storage transistors 1980 in a NAND string 1990 according to various embodiments of the invention. The charge storage transistors 1980 may also be called memory cells. Each charge storage transistor 1980 includes at least a portion of one of the rings of p+ type polysilicon 1270 that is a charge storage structure separated from the U-shaped pipe channel 1496 by the tunneling dielectric 1492. Each charge storage transistor 1980 also includes at least a portion of one of the metal word lines 1852 separated from the ring of p+ type polysilicon 1270 by the IPD (e.g., silicon dioxides (SiO$_2$) 1838 and 1846 and silicon nitride (Si$_3$N$_4$) 1842). Access devices (not shown) are formed beneath the semiconductor construction 900 to access the channels and the charge storage transistors 1980 through the U-shaped pipe channels 1496. Each NAND string 1990 is shown including three charge storage transistors 1980, and six NAND strings 1990 are shown in FIG. 19 that comprise an array of charge storage transistors 1980 or memory cells. Each NAND string may include more charge storage transistors, and the semiconductor construction 900 may include more NAND strings according to various embodiments of the invention.

Figure 20:
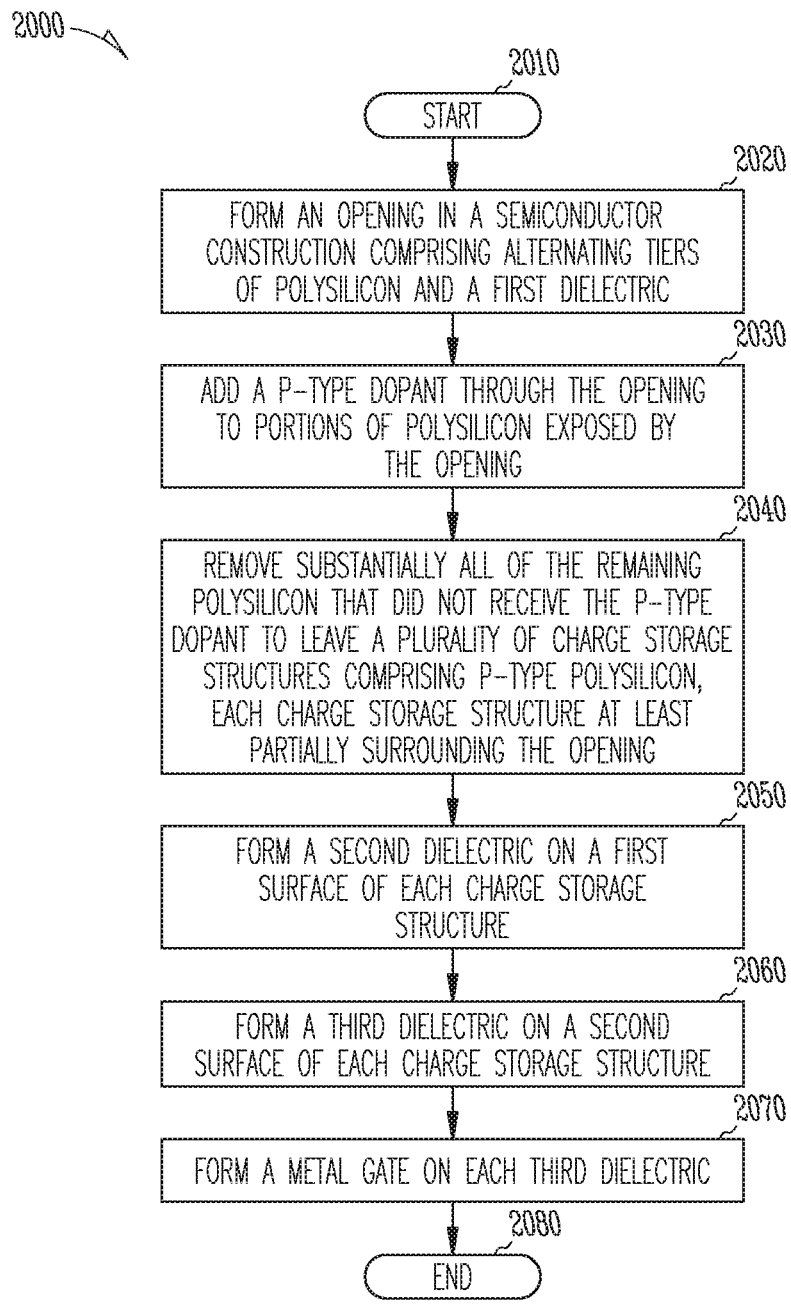
FIG. 20 is a flow diagram of methods according to various embodiments of the invention.

FIG. 20 is a flow diagram of one method 2000 according to various embodiments of the invention. In block 2010, the method 2000 starts. In block 2020, an opening is formed in a semiconductor construction comprising alternating tiers of polysilicon and a first dielectric. In block 2030, a p-type dopant is added through the opening to portions of polysilicon exposed by the opening. In block 2040, at least substantially all of the remaining polysilicon that did not receive the p-type dopant is removed to leave a plurality of charge storage structures comprising p-type polysilicon, each charge storage structure at least partially surrounding the opening in its tier. In block 2050, a second dielectric is formed on a first surface of each charge storage structure (e.g., between the charge storage structure and the opening). In block 2060, a third dielectric is formed on a second surface of each charge storage structure (e.g., where the polysilicon was removed). In block 2070, a metal gate is formed on each third dielectric. In block 2080, the method 2000 ends. Various embodiments may have more or fewer activities than those shown in FIG. 20. In some embodiments, the activities may be repeated, and/or performed in serial or parallel fashion.

Multi-tiered semiconductor devices can be expensive to fabricate because it is difficult to form features in multiple tiers of semiconductor material. The inventors have discovered that at least some of the challenges noted above, as well as others, can be addressed by forming an opening in a semiconductor construction where the semiconductor construction comprises alternating tiers of, for example, polysilicon and a dielectric. Dopant can be added to the polysilicon exposed by the opening and at least substantially all of the polysilicon that did not receive the dopant is removed to leave portions of doped polysilicon around the opening. Dielectrics are formed around each of the portions of doped polysilicon. The portions of doped polysilicon are therefore substantially electrically isolated from each other such that operations involving one do not substantially affect neighboring portions of doped polysilicon. For example, when one of the portions of doped polysilicon is programmed or read as a charge storage structure the potential of neighboring portions is not substantially changed as a result.

Figure 21:
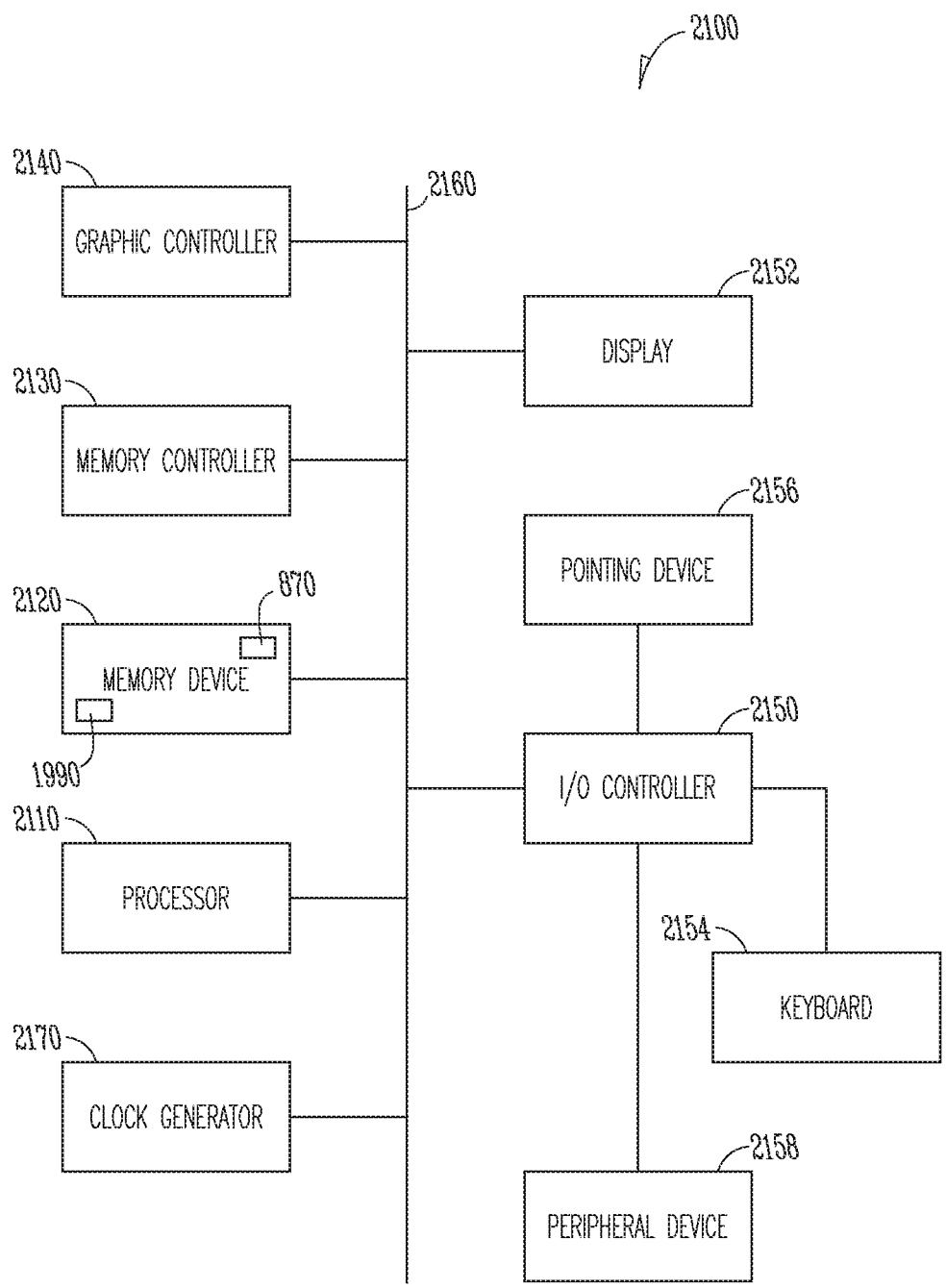
FIG. 21 is a diagram illustrating a system according to various embodiments of the invention.

FIG. 21 is a diagram illustrating a system 2100 according to various embodiments of the invention. The system 2100 may include a processor 2110, a memory device 2120, a memory controller 2130, a graphic controller 2140, an input and output (I/O) controller 2150, a display 2152, a keyboard 2154, a pointing device 2156, and a peripheral device 2158. A bus 2160 couples all of these devices together. A clock generator 2170 is coupled to the bus 2160 to provide a clock signal to at least one of the devices of the system 2100 through the bus 2160. The clock generator 2170 may include an oscillator in a circuit board such as a motherboard. Two or more devices shown in system 2100 may be formed in a single integrated circuit chip. The memory device 2120 may comprise devices such as an array of NAND strings 870 of memory cells and/or an array of NAND strings 1990 of memory cells described herein and shown in the figures according to various embodiments of the invention. The bus 2160 may be interconnect traces on a circuit board or may be one or more cables. The bus 2160 may couple the devices of the system 2100 by wireless means such as by electromagnetic radiations, for example, radio waves. The peripheral device 2158 coupled to the I/O controller 2150 may be a printer, an optical device such as a CD-ROM and a DVD reader and writer, a magnetic device reader and writer such as a floppy disk driver, or an audio device such as a microphone.

The system 2100 represented by FIG. 21 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any of the circuits or systems described herein may be referred to as a module. A module may comprise a circuit and/or firmware according to various embodiments.

Example structures and methods of fabricating charge storage transistors have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory structure, comprising:
 a vertical string of charge storage devices, each charge storage device including a respective charge storage structure surrounding a vertical film comprising polysilicon and forming a vertical film channel structure, and wherein each charge storage structure in the string is spaced from at least one vertically adjacent charge storage structure by a respective dielectric tier, and wherein each charge storage structure extends between and contacts vertically adjacent dielectric tiers;
 a first dielectric structure between a first side of each of the charge storage devices of the vertical string and the vertical film channel structure; and
 a second dielectric structure on a second side of the respective charge storage structures of the vertical string, the second dielectric structure extending between the charge storage structures and a respective gate surrounding the charge storage structure, the respective gates having a planar vertical surface extending adjacent the charge storage structure, the second dielectric structure having multiple dielectric materials, including a first dielectric material extending concentric to a respective charge storage structure and having a vertical dimension greater than the vertical dimension of the respective charge storage structure and a second dielectric material having a vertical dimension greater than the vertical dimensions of the adjacent charge storage structure and greater than the vertical dimension of the planar vertical surface of the adjacent gate.

2. The memory structure of claim 1, wherein each charge storage structure includes a floating gate comprising polysilicon.

3. The memory structure of claim 1, wherein the respective gates comprise metal.

4. The memory structure of claim 1, wherein:
the first dielectric structure comprises silicon dioxide or silicon nitride; and
the second dielectric structure comprises one or more of silicon dioxide and silicon nitride.

5. The memory structure of claim 4, wherein the first dielectric material of the second dielectric structure comprises an oxide, and wherein the second dielectric material of the second dielectric structure comprises a nitride, and wherein the second dielectric structure further comprises a third dielectric material comprising oxide on the opposite side of the nitride from the first dielectric material.

6. The memory structure of claim 1, wherein the vertical pillar comprises a portion of a U-shaped pipe.

7. The memory structure of claim 1, wherein the first dielectric structure forms a tunneling dielectric.

8. The memory structure of claim 1, wherein the respective gates are each part of metal word lines extending between the respective dielectric tiers.

* * * * *